(12) United States Patent
Guilfoyle et al.

(10) Patent No.: US 9,085,484 B2
(45) Date of Patent: Jul. 21, 2015

(54) ANTI-GLARE SURFACE TREATMENT METHOD AND ARTICLES THEREOF

(75) Inventors: Diane Kimberlie Guilfoyle, Painted Post, NY (US); Jeffrey Todd Kohli, Corning, NY (US); Kelvin Nguyen, Corning, NY (US); Lu Zhang, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 1020 days.

(21) Appl. No.: 13/090,561

(22) Filed: Apr. 20, 2011

(65) Prior Publication Data

US 2011/0267698 A1    Nov. 3, 2011

Related U.S. Application Data

(60) Provisional application No. 61/329,936, filed on Apr. 30, 2010, provisional application No. 61/372,655, filed on Aug. 11, 2010.

(51) Int. Cl.
| | |
|---|---|
| *C03C 15/00* | (2006.01) |
| *B44C 1/22* | (2006.01) |
| *B81C 1/00* | (2006.01) |
| *C03C 3/087* | (2006.01) |
| *C03C 3/093* | (2006.01) |
| *C03C 17/00* | (2006.01) |
| *G02F 1/1335* | (2006.01) |

(52) U.S. Cl.
CPC .................. *C03C 15/00* (2013.01); *B44C 1/227* (2013.01); *B81C 1/00539* (2013.01); *C03C 3/087* (2013.01); *C03C 3/093* (2013.01); *C03C 17/007* (2013.01); *C03C 2204/08* (2013.01); *C03C 2217/42* (2013.01); *C03C 2218/34* (2013.01); *C03C 2218/355* (2013.01); *G02F 1/133502* (2013.01); *Y10T 428/24355* (2015.01)

(58) Field of Classification Search
CPC ................ C03C 15/00; C03C 2217/42; C03C 2218/355; C03C 2204/08; C03C 3/093; C03C 3/087; C03C 17/007; G02F 1/133502; B44C 1/227; B81C 1/00539; B81C 2201/053
See application file for complete search history.

(56) References Cited

U.S. PATENT DOCUMENTS

| | | | |
|---|---|---|---|
| 1,861,577 A | 6/1932 | Mattman | |
| 3,616,098 A * | 10/1971 | Falls | ............................ 428/141 |

(Continued)

FOREIGN PATENT DOCUMENTS

| | | |
|---|---|---|
| CN | 101526685 | 9/2009 |
| JP | 5013021 | 1/1993 |

(Continued)

OTHER PUBLICATIONS

Corning Gorilla® Glass, Collateral,www.corning.com, (Mar. 15, 2010), 2 pages.

*Primary Examiner* — Lan Vinh
*Assistant Examiner* — Jiong-Ping Lu
(74) *Attorney, Agent, or Firm* — John L. Haack

(57) ABSTRACT

A glass article including: at least one anti-glare surface having haze, distinctness-of-image, surface roughness, and uniformity properties, as defined herein. A method of making the glass article includes, for example, depositing sacrificial particles on a surface of the article; and contacting the resulting particulated surface with an etchant. A display system that incorporates the glass article, as defined herein, is also disclosed.

7 Claims, 9 Drawing Sheets

(56) References Cited

U.S. PATENT DOCUMENTS

| | | | |
|---|---|---|---|
| 4,451,329 A | 5/1984 | Batchelor et al. | 156/660 |
| 4,460,621 A * | 7/1984 | Pearlman | 427/64 |
| 4,664,748 A | 5/1987 | Ueno et al. | |
| 4,808,462 A | 2/1989 | Yaba et al. | |
| 4,921,626 A | 5/1990 | Rhodenbaugh | 252/79.4 |
| 5,415,731 A * | 5/1995 | Kim | 216/97 |
| 5,755,944 A | 5/1998 | Haven et al. | |
| 5,989,450 A | 11/1999 | Kim | 252/79.4 |
| 6,807,824 B1 | 10/2004 | Miwa | 65/31 |
| 2004/0035153 A1* | 2/2004 | Koike et al. | 65/61 |
| 2004/0195201 A1 | 10/2004 | Chao et al. | 216/2 |
| 2004/0245212 A1 | 12/2004 | Ji et al. | |
| 2009/0176015 A1 | 7/2009 | Nakanishi et al. | 427/162 |
| 2010/0038342 A1 | 2/2010 | Lim et al. | 216/41 |

FOREIGN PATENT DOCUMENTS

| | | |
|---|---|---|
| JP | 8165144 | 6/1996 |
| JP | 2000261008 | 9/2000 |
| JP | 2007170754 | 7/2007 |
| JP | 2008137867 | 6/2008 |
| JP | 2010061038 | 3/2010 |
| WO | 02/053508 | 7/2002 |
| WO | 2008/123650 A1 | 10/2008 |

* cited by examiner

US 9,085,484 B2

ANTI-GLARE SURFACE TREATMENT METHOD AND ARTICLES THEREOF

CLAIMING BENEFIT OF PRIOR FILED APPLICATION

This application claims the benefit of priority of U.S. Patent Provisional Application No. 61/329,936, filed on Apr. 30, 2010 and U.S. Patent Provisional Application No. 61/372,655, filed on Aug. 11, 2010.

The entire disclosure of any publication or patent document mentioned herein is incorporated by reference.

BACKGROUND

The disclosure relates generally to methods of making and using an anti-glare surface and articles thereof.

SUMMARY

The disclosure provides a method of making an anti-glare surface, articles made by the method, and a display system incorporating the article having the anti-glare surface. The method of making includes depositing sacrificial particles on at least one surface of an article and contacting the particle treated surface (particulated surface) with an etchant to form the anti-glare surface.

BRIEF DESCRIPTION OF THE DRAWING(S)

In embodiments of the disclosure:

Figure 5A:
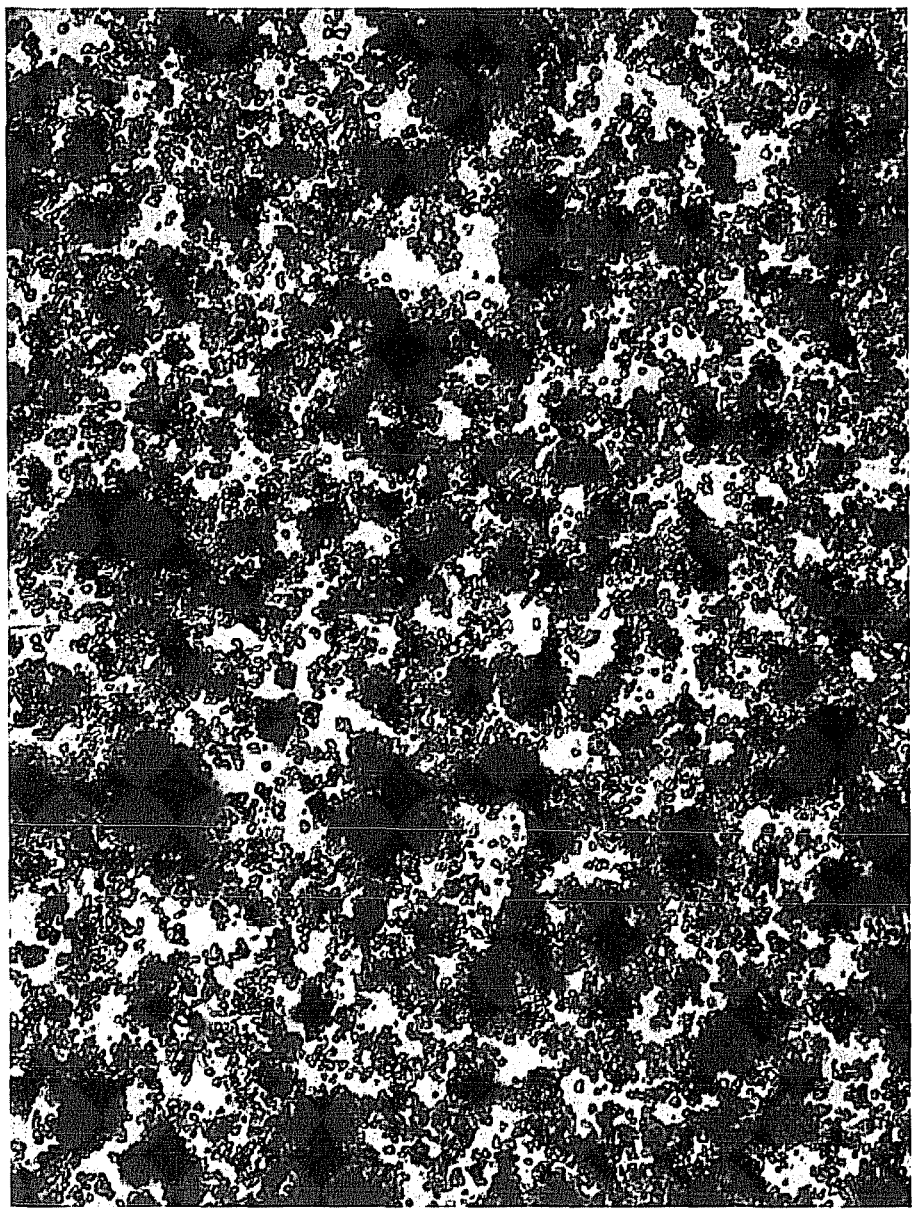
Figure 5B:
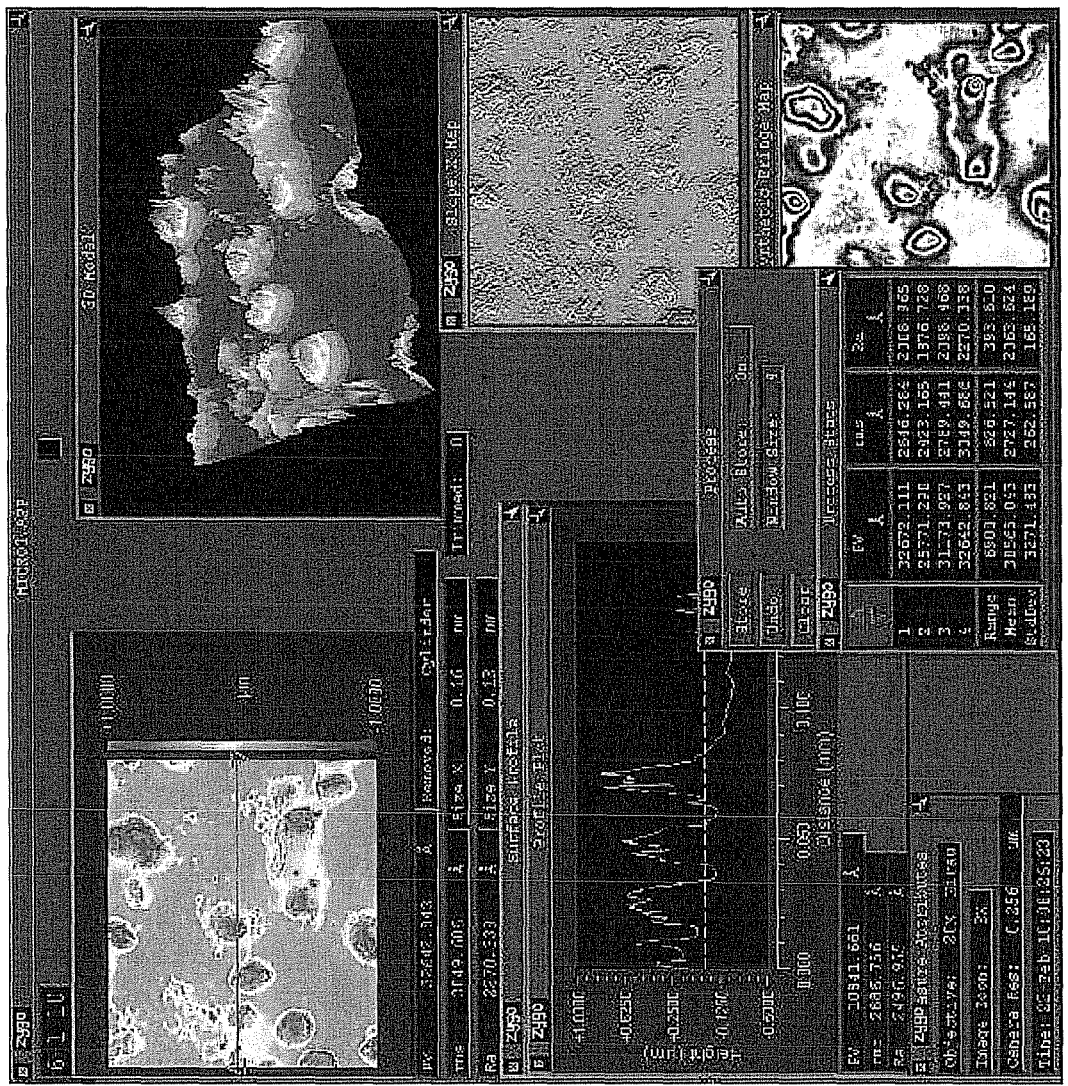

FIGS. 5a and 5b, respectively, show the glass surface before etching and a Zygo profile after etching, for a representative spray-coated sample.

Figure 6:
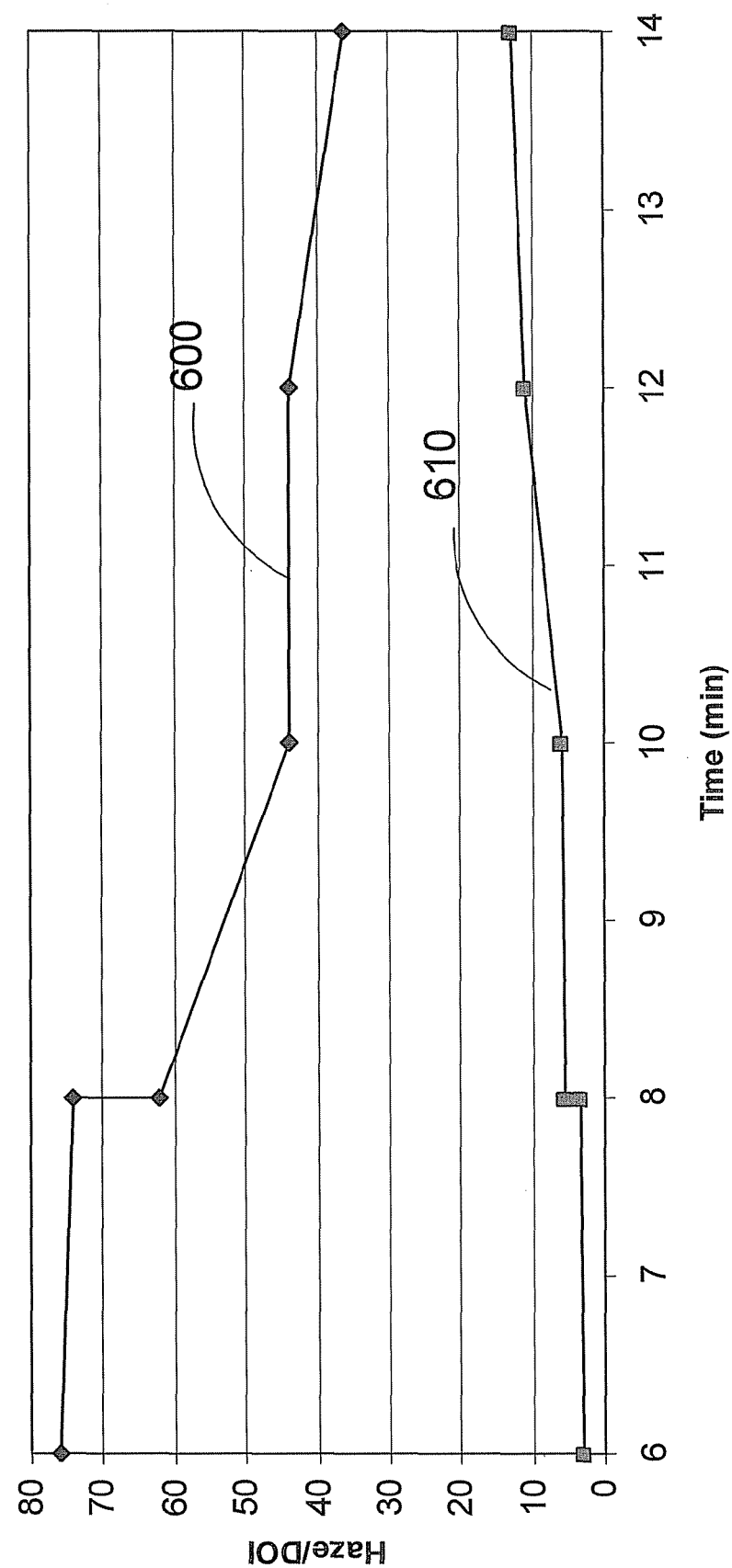

FIG. 6 shows results of etch time v. DOI and Haze properties for surface preparations made with smaller glass particle size ($D_{50}$ of 0.7 micrometers).

Figure 7:
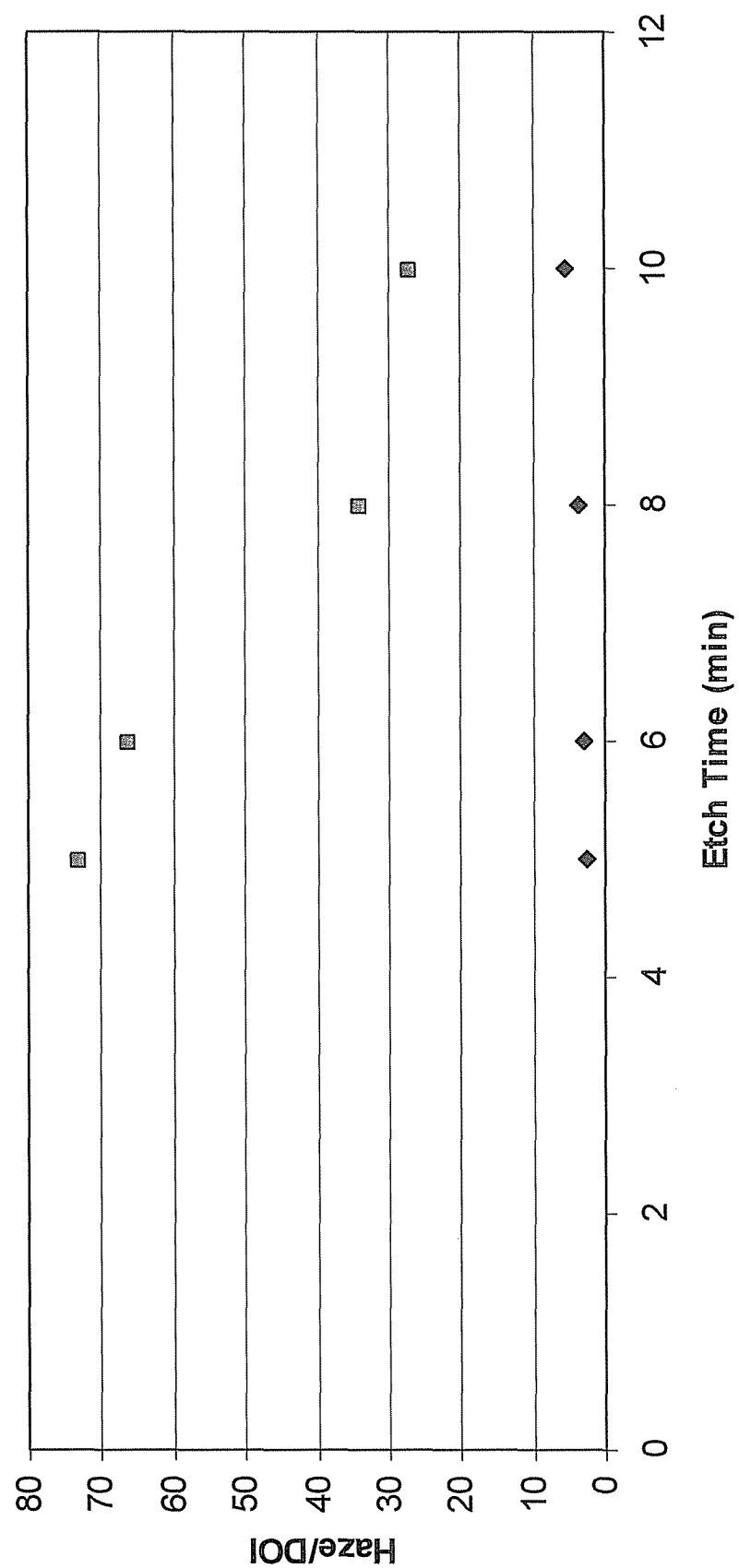

FIG. 7 shows results of etch time v. DOI and Haze properties for a soda lime glass were particulated with glass particles having larger particle sizes ($D_{50}$ of 3.5 micrometers) compared to particles used in obtaining the FIG. 6 results.

Figure 8:
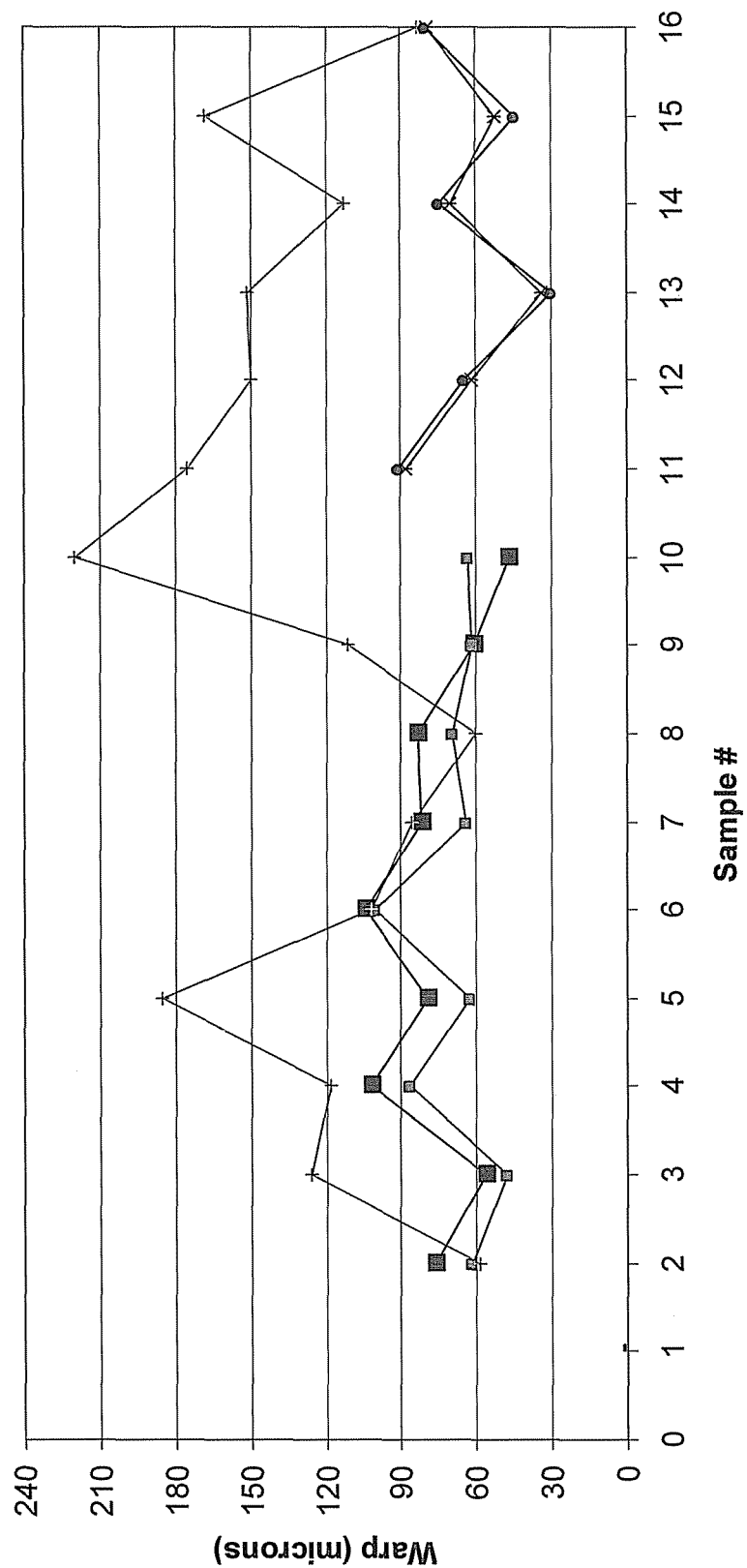

FIG. 8 shows results of a study of glass warp on eight inch square (8"×8") glass sheets.

Figure 9:
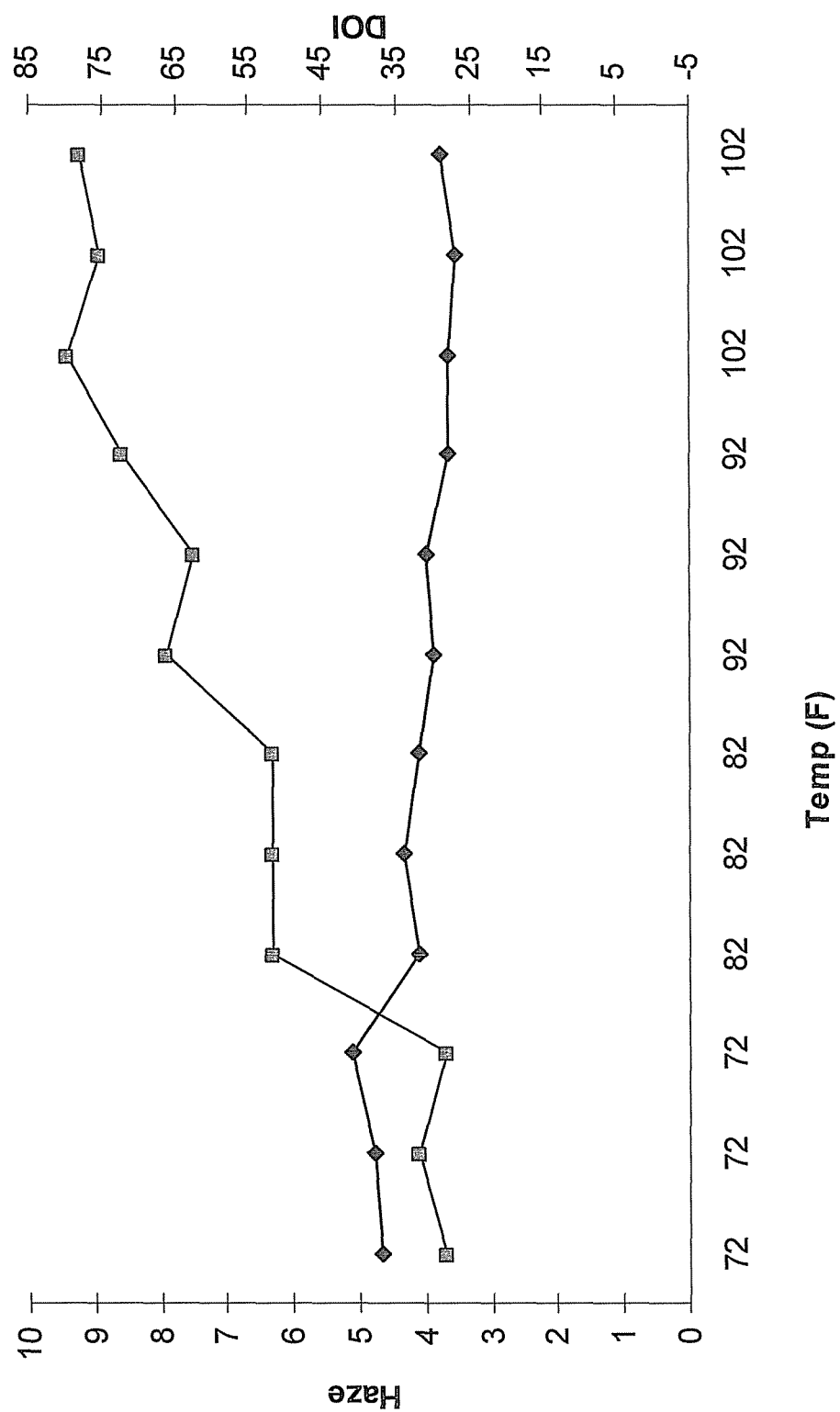

FIG. 9 is a graph that shows the temperature effect on the Haze and DOI for 12 micron particles after etching.

DETAILED DESCRIPTION

Various embodiments of the disclosure will be described in detail with reference to drawings, if any. Reference to various embodiments does not limit the scope of the invention, which is limited only by the scope of the claims attached hereto. Additionally, any examples set forth in this specification are not limiting and merely set forth some of the many possible embodiments of the claimed invention.

DEFINITIONS

"Anti-glare" or like terms refer to a physical transformation of light contacting the treated surface of an article, such as a display, of the disclosure that changes, or to the property of changing light reflected from the surface of an article, into a diffuse reflection rather than a specular reflection. In embodiments, the surface treatment can be produced by mechanical or chemical etching. Anti-glare does not reduce the amount of light reflected from the surface, but only changes the characteristics of the reflected light. An image reflected by an anti-glare surface has no sharp boundaries. In contrast to an anti-glare surface, an anti-reflective surface is typically a thin-film coating that reduces the reflection of light from a surface via the use of refractive-index variation and, in some instances, destructive interference techniques.

"Contacting" or like terms refer to a close physical touching that can result in a physical change, a chemical change, or both, to at least one touched entity. In the present disclosure various particulate deposition or contacting techniques, such as spray coating, dip coating, and like techniques, can provide a particulated surface when contacted as illustrated and demonstrated herein. Additionally or alternatively, various chemical treatments of the particulated surface, such as spray, immersion, and like techniques, or combinations thereof, as illustrated and demonstrated herein, can provide an etched surface when contacted with one or more etchant compositions.

"Distinctness-of-reflected image," "distinctness-of-image," "DOI" or like term is defined by method A of ASTM procedure D5767 (ASTM 5767), entitled "Standard Test Methods for Instrumental Measurements of Distinctness-of-Image Gloss of Coating Surfaces." In accordance with method A of ASTM 5767, glass reflectance factor measurements are made on the at least one roughened surface of the glass article at the specular viewing angle and at an angle slightly off the specular viewing angle. The values obtained from these measurements are combined to provide a DOI value. In particular, DOI is calculated according to equation (1):

$$DOI = \left[1 - \frac{Ros}{Rs}\right] \times 100 \qquad (1)$$

where Rs is the relative amplitude of reflectance in the specular direction and Ros is the relative amplitude of reflectance in an off-specular direction. As described herein, Ros, unless otherwise specified, is calculated by averaging the reflectance over an angular range from 0.2° to 0.4° away from the specular direction. Rs can be calculated by averaging the reflectance over an angular range of ±0.05° centered on the specular direction. Both Rs and Ros were measured using a goniophotometer (Novo-gloss IQ, Rhopoint Instruments) that is calibrated to a certified black glass standard, as specified in ASTM procedures D523 and D5767. The Novo-gloss instrument uses a detector array in which the specular angle is centered about the highest value in the detector array. DOI was also evaluated using 1-side (black absorber coupled to rear of glass) and 2-side (reflections allowed from both glass surfaces, nothing coupled to glass) methods. The 1-side measurement allows the gloss, reflectance, and DOI to be determined for a single surface (e.g., a single roughened surface) of the glass article, whereas the 2-side measurement enables gloss, reflectance, and DOI to be determined for the glass article as a whole. The Ros/Rs ratio can be calculated from the average values obtained for Rs and Ros as described above. "20° DOI," or "DOI 20°" refers to DOI measurements in which the light is incident on the sample at 20° off the normal to the glass surface, as described in ASTM D5767. The measurement of either DOI or common gloss using the 2-side method can best be performed in a dark room or enclosure so that the measured value of these properties is zero when the sample is absent.

For anti-glare surfaces, it is generally desirable that DOI be relatively low and the reflectance ratio (Ros/Rs) of eq. (1) be relatively high. This results in visual perception of a blurred or indistinct reflected image. In embodiments, the at least one roughened surface of the glass article has a Ros/Rs greater than about 0.1, greater than about 0.4, and, greater than about 0.8, when measured at an angle of 20° from the specular direction using the 1-side method measurement. Using the 2-side method, the Ros/Rs of the glass article at a 20° angle from the specular direction is greater than about 0.05. In embodiments, the Ros/Rs measured by the 2-side method for the glass article is greater than about 0.2, and greater than about 0.4. Common gloss, as measured by ASTM D523, is insufficient to distinguish surfaces with a strong specular reflection component (distinct reflected image) from those with a weak specular component (blurred reflected image). This can be attributable to the small-angle scattering effects that are not measurable using common gloss meters designed according to ASTM D523.

"Transmission haze," "haze," or like terms refer to a particular surface light scatter characteristic related to surface roughness. Haze measurement is specified in greater detail below.

"Roughness," "surface roughness (Ra)," or like terms refer to, on a microscopic level or below, an uneven or irregular surface condition, such as an average root mean squared (RMS) roughness or RMS roughness described below.

"Gloss," "gloss level," or like terms refer to, for example, surface luster, brightness, or shine, and more particularly to the measurement of specular reflectance calibrated to a standard (such as, for example, a certified black glass standard) in accordance with ASTM procedure D523, the contents of which are incorporated herein by reference in their entirety. Common gloss measurements are typically performed at incident light angles of 20°, 60°, and 85°, with the most commonly used gloss measurement being performed at 60°. Due to the wide acceptance angle of this measurement, however, common gloss often cannot distinguish between surfaces having high and low distinctness-of-reflected-image (DOI) values. The anti-glare surface of the glass article has a gloss (i.e.; the amount of light that is specularly reflected from sample relative to a standard at a specific angle) of up to 90 SGU (standard gloss units), as measured according to ASTM standard D523, and, in one embodiment, has a gloss in a range from about 60 SGU up to about 80 SGU. See also the DOI definition above.

"ALF" or "average characteristic largest feature size" or like terms refer to a measure of surface feature variation in the x- and y-directions, i.e., in the plane of the substrate, as discussed further below.

"Sparkle," "display sparkle," or like terms refer to the relationship between the size of features on the at least one roughened glass surface and pixel pitch, particularly the smallest pixel pitch, is of interest. Display "sparkle" is commonly evaluated by human visual inspection of a material that is placed adjacent to a pixelated display. ALF and its relationship to display "sparkle" has been found to be a valid metric for different materials having different surface morphologies, including glasses of varying composition and particle-coated polymer materials. A strong correlation between average largest characteristic feature size (ALF) and visual ranking of display sparkle severity exists across multiple different sample materials and surface morphologies. In embodiments, the glass article can be a glass panel that forms a portion of a display system. The display system can include a pixelated image display panel that is disposed adjacent to the glass panel. The smallest pixel pitch of the display panel can be greater than ALF.

"Uniformity," "uniform" or like terms refer to the surface quality of an etched sample. Surface uniformity is commonly evaluated by human visual inspection at various angles. For example, the glass article sample is held at about eye level, and then slowly turned from 0 to 90 deg., under a standard, white fluorescent light condition. When no pin-holes, cracks, waviness, roughness, or other like defects can be detected by the observer, the surface quality is deemed "uniform"; otherwise, the sample is deemed not uniform. "Good" or "OK" ratings mean that the uniformity is acceptable or satisfactory with the former being subjectively better than the latter.

"Include," "includes," or like terms means encompassing but not limited to, that is, inclusive and not exclusive.

"About" modifying, for example, the quantity of an ingredient in a composition, concentrations, volumes, process temperature, process time, yields, flow rates, pressures, and like values, and ranges thereof, employed in describing the embodiments of the disclosure, refers to variation in the numerical quantity that can occur, for example: through typical measuring and handling procedures used for preparing materials, compositions, composites, concentrates, or use formulations; through inadvertent error in these procedures; through differences in the manufacture, source, or purity of starting materials or ingredients used to carry out the methods; and like considerations. The term "about" also encompasses amounts that differ due to aging of a composition or formulation with a particular initial concentration or mixture, and amounts that differ due to mixing or processing a composition or formulation with a particular initial concentration or mixture. The claims appended hereto include equivalents of these "about" quantities.

"Consisting essentially of" in embodiments can refer to, for example:

a method of making a glass article by depositing sacrificial particles on a surface of the article; and contacting the particulated surface with an etchant;

a glass article having an anti-glare surface having haze, distinctness-of-image, surface roughness, and uniformity properties, as defined herein; or a display system that incorporates the glass article, as defined herein.

The method of making, the article, the display system, compositions, formulations, or any apparatus of the disclosure, can include the components or steps listed in the claim, plus other components or steps that do not materially affect the basic and novel properties of the compositions, articles, apparatus, or methods of making and use of the disclosure, such as particular reactants, particular additives or ingredients, a particular agent, a particular surface modifier or condition, or like structure, material, or process variable selected. Items that may materially affect the basic properties of the components or steps of the disclosure or that may impart undesirable characteristics to the present disclosure include, for example, a surface having objectionable high glare or high gloss properties, for example, having a haze, a distinctness-of-image, a surface roughness, a uniformity, or a combination thereof, that are beyond the values, including intermediate values and ranges, defined and specified herein.

The indefinite article "a" or "an" and its corresponding definite article "the" as used herein means at least one, or one or more, unless specified otherwise.

Abbreviations, which are well known to one of ordinary skill in the art, may be used (e.g., "h" or "hr" for hour or hours, "g" or "gm" for gram(s), "mL" for milliliters, and "rt" for room temperature, "nm" for nanometers, and like abbreviations).

Specific and preferred values disclosed for components, ingredients, additives, and like aspects, and ranges thereof, are for illustration only; they do not exclude other defined values or other values within defined ranges. The compositions, apparatus, and methods of the disclosure can include any value or any combination of the values, specific values, more specific values, and preferred values described herein.

Chemically strengthened glasses are used in many hand-held and touch-sensitive devices as display windows and cover plates where resistance to mechanical damage can be significant to the visual appearance and functionality of the product.

Reduction in the specular reflection (a significant factor in glare) from these display surfaces is often desired, especially by manufacturers whose products are designed for outdoor use where glare can be exacerbated by sunlight. One way to reduce the intensity of the specular reflection, quantified as gloss, is to roughen the glass surface or cover it with a textured film. The dimensions of the roughness or texture should be large enough to scatter visible light, producing a slightly hazy or matte surface, but not too large as to significantly affect the transparency of the glass. Textured or particle-containing polymer films can be used when maintaining the properties (e.g., scratch resistance) of the glass substrate are not important. While these films maybe cheap and easy to apply, they are subject to easy abrasion which can reduce the display functionality of the device. Another approach to roughening the glass surface is chemical etching. U.S. Pat. Nos. 4,921, 626, 6,807,824, 5,989,450, and WO2002053508, mention glass etching compositions and methods of etching glass with the compositions.

One result of roughening a glass surface is to create "sparkle," which is perceived as a grainy appearance. Sparkle is manifested by the appearance of bright and dark or colored spots at approximately the pixel-level size scale. The presence of sparkle reduces the viewability of pixilated displays, particularly under high ambient lighting conditions.

In embodiments, the disclosure provides a wet etch method for generating an anti-glare surface on the glass while preserving its inherent mechanical surface properties. During this process, a particulated glass surface is exposed to chemicals which can degrade the surface to alter the surface roughness dimensions that are responsible for scattering visible light. When significant quantities of mobile alkali ions are present in the glass, such as in soda lime silicate glasses, a roughened surface can be formed by, for example, contacting the glass surface in an acid etchant solution, such as a solution containing fluoride ion.

In embodiments, the disclosure provides a method of making an article having an anti-glare surface, comprising:

depositing particles on at least one surface of the article; and contacting the at least one surface of the article having the deposited particles with an etchant to form the anti-glare surface.

In embodiments, the at least one surface of the article can be, for example, a glass, a composite, a ceramic, a plastic or resin based material, and like materials, or combinations thereof. In embodiments, the deposited particles can be, for example, a glass, a composite, a ceramic, a plastic or resin based material, a metal, a salt, a clay, a polymer, a copolymer, nano-particles, cross-linked polymer particles, UV cured particles, and like materials, or combinations thereof. In embodiments, the etchant can be comprised of at least one acid suitable for etching the surface beneath the deposited particles.

In embodiments, the glass surface and the glass particles can be independently selected from, for example, at least one aluminosilicate, aluminoborosilicate, soda lime, borosilicate, silica, and like glasses, or a combination thereof, and the etchant can comprise at least one acid selected from HF, $H_2SO_4$, or a combination thereof.

The depositing of particles on at least one surface of the article can include, for example, forming a concentrated liquid suspension of the particles, diluting the concentrated suspension with a diluent, and contacting the at least one surface with the diluted suspension.

Additionally or alternatively, the contacting the at least one surface with particles can be accomplished with a concentrated particle suspension, or a particle suspension of intermediate concentration. The particle-surface contacting can be accomplished using any suitable method, for example, spin-coating, spray-coating, roll-coating, laminating, brushing, dipping, and like application methods, or a combination thereof. The deposited particles can have, for example, a $D_{50}$ diameter of from about 0.1 to about 10 micrometers, from about 1 to about 10 micrometers, and from about 1 to about 5 micrometers, including intermediate values and ranges. In embodiments, the particle size range can be, for example, from about 0.1 to about 50 micrometers, 1 to about 30 micrometers, and like particle diameters including intermediate values and ranges.

In embodiments, the contacting of the particulated surface with an etchant can be accomplished by, for example, exposing the surface having the deposited particles to the etchant, for example, for from about 1 second to about 30 minutes, including intermediate values and ranges.

In embodiments, the preparative method can optionally further include, for example, washing the resulting etched anti-glare surface, chemically strengthening the anti-glare surface, applying a functional coating or film (e.g., a light sensitive or polarizing film) or protective surface coating or film, and like coatings or films, or a combination thereof.

In embodiments, when a single-side acid-etch, or like modification is desired on a sheet of glass, one side of the glass can be protected from the etching solution. Protection can be achieved, for example, by applying an insoluble non-porous coating such as an acrylic wax, or a laminate film having an adhesive layer, for example, an acrylic, a silicone, and like adhesives materials, or combinations thereof. Coating application methods can include, for example, brushing, rolling, spraying, laminating, and like methods. The acid-etch exposed insoluble non-porous protective coating survives the etching process and can be readily removed after the etching. Removing the protective film from the surface of the article can be accomplished using any suitable method, such as contacting the protective film with a dissolving liquid, heating the film to liquefy and drain, and like methods and materials, or a combination thereof. Thus, the preparative method can optionally further include, prior to etching, contacting at least another surface, e.g., a second surface such as the backside of a glass sheet, of the article with an optionally removable, etch-resistant protective layer.

In embodiments, the disclosure provides an article prepared by any of the preparative processes disclosed herein, such as a glass article prepared by the above mentioned particle deposition and etching process.

In embodiments, the at least one surface of the article can be a glass, the deposited particles can be a polymer, and the etchant can be at least one acid.

In embodiments, the disclosure provides a glass article comprising:
at least one anti-glare surface having:
a haze of, for example, from about 0.1 to about 30, such as from about 0.1 to about 25, from about 0.1 to about 20, from about 0.1 to about 10, and from about 1 to about 10, and low haze, such as from about 0.1 to about 5, and from about 1 to about 5, including intermediate values and ranges;
a distinctness-of-image (DOI 20°) of, for example, from about 25 to about 85, from about 40 to about 80, from about 45 to about 75, and from about 50 to about 70, including intermediate values and ranges;
a surface roughness (Ra) of, for example, from about 50 to about 500 nm, and from about 100 to about 300 nm, including intermediate values and ranges; and
an average roughness peak-to-valley profile of from about 0.1 to about 10 micrometers, including intermediate values and ranges.

In embodiments, the glass article having anti-glare surface of the disclosure can comprise a distribution of topographic features having an average diameter of about 1 to about 100 micrometers, about 1 to about 50 micrometers, including intermediate values and ranges.

In embodiments, the disclosure provides a display system including, for example:
a glass panel having at least one roughened anti-glare surface having:
a haze of from about 0.1 to less than about 30 including intermediate values and ranges;
a distinctness-of-image (DOI 20°) of from about 40 to about 80, including intermediate values and ranges;
a surface roughness (Ra) of from about 100 to about 300 nm, including intermediate values and ranges; and
an average roughness peak-to-valley difference profile of from about 0.1 to about 10 micrometers, including intermediate values and ranges; and
a pixelated image-display panel adjacent to the glass panel.

In embodiments, the disclosure provides a method of creating an anti-glare glass surface, including, for example:
contacting a glass surface with a liquid suspension of glass particles; and
contacting the resulting particulated glass surface and an etchant to form the anti-glare surface.

In embodiments, the disclosure provides a wet etch process to form a uniform, nano- to micro-scale textured surface on most silicate glasses and without having a significant impact on chemical strengthening capability of the glass. The process includes depositing or otherwise coating glass particles, such as glass or composite particles, on the glass surface, followed by acid etching, such as in an HF, or multi-component acid solution. In embodiments, the HF solution can preferentially etch around the glass particles deposited on the glass surface, then subsequently erodes the glass particles from the etched surface, and can also reduce the surface roughness.

In embodiments, the desired reduced gloss or glare levels can be obtained, for example, by adjusting at least one or more of the following parameters: the viscosity of the particulate suspension, the binder level in the suspension, the level or concentration of the glass or like particles in the suspension, the concentration of the acid etchant, the amount of glass or like particles deposited on the surface, the particle size distribution (PDS) of the glass or like particles used, and the exposure interval or the time that the particle-bearing surface of the glass sample is in contact with the acid etchant.

In embodiments, an anti-glare glass article is provided. The glass article can be ion-exchangeable and can have at least one roughened surface. The roughened surface has a distinctness-of-reflected image (DOI) of less than 90 when measured at an incidence angle of 20° (DOI at 20°). A pixelated display system that includes the anti-glare glass article is also provided. The glass article can be, for example, a planar sheet or panel having two major surfaces joined on the periphery by at least one edge, although the glass article can be formed into other shapes such as, for example, a three-dimensional shape. At least one of the surfaces is a roughened surface including, for example, topological or morphological features, such as, projections, protrusions, depressions, pits, closed or open cell structures, particles, islands, lands, trenches, fissures, crevices, and like geometries and features, or combinations thereof.

In embodiments, the disclosure provides an aluminosilicate glass article. The aluminosilicate glass article can include, for example, at least 2 mol % $Al_2O_3$, can be ion-exchangeable, and can have at least one roughened surface. The aluminosilicate glass article can have at least one roughened surface comprising a plurality of topographical features. The plurality of topographical features can have an average characteristic largest feature size (ALF) of from about 1 micrometer to about 50 micrometers.

In embodiments, the disclosure provides a display system. The display system can include, for example, at least one glass panel and a pixelated image-display panel adjacent to the glass panel. The image-display panel can have a minimum native pixel pitch dimension. The average characteristic largest feature size (ALF) of the glass panel can be less than the minimum native pixel pitch dimension of the display panel. The pixelated image display panel can be, for example, one of an LCD display, an OLED display, or like display devices. The display system can also include touch-sensitive elements or surfaces. The glass can be, for example, any of the aforementioned glasses, such as an aluminosilicate ion-exchanged glass that has at least one roughened surface including a plurality of features having an ALF, and the image-displaying panel has a minimum native pixel pitch. The minimum native pixel pitch can be, for example, greater than the ALF of the roughened surface of the glass panel.

ALF is measured in the plane of (i.e., parallel to) the roughened glass surface, and is therefore independent of roughness. ALF is a measurement of feature variation in the x- and y-directions, i.e., in the plane of the roughened glass surface. Selecting the largest characteristic features is a useful distinction from other methods that determine a more global average feature size. The largest features are most easily seen by the human eye and are therefore most important in determining visual acceptance of the glass article. In embodiments, the topological or morphological features of the at least one roughened surface has an average characteristic largest feature (ALF) size of from about 1 micrometer to about 50 micrometers, of from about 5 micrometers to about 40 micrometers; of from about 10 micrometers to about 30 micrometers; and from about 14 micrometers to about 28 micrometers, including intermediate values and ranges. The average characteristic largest feature size is the average cross-sectional linear dimension of the twenty largest repeating features within a viewing field on a roughened surface. A standard calibrated optical light microscope can typically be used to measure feature size. The viewing field is proportional to the feature size, and typically has an area of approximately 30(ALF)×30(ALF). If, for example, the ALF is approximately 10 micrometers, then the viewing field from which the twenty largest features are selected is approximately 300 micrometers×300 micrometers. Small changes in the size of the viewing field do not significantly affect ALF. The standard deviation of the twenty largest features that are used to determine ALF should generally be less than about 40% of the average value, i.e., major outliers should be ignored since these are not considered "characteristic" features.

The topography of the anti-glare surface can include, for example, features such as protrusions or projections, depressions, and like features having a maximum dimension of less than about 400 nm. In embodiments, these topographical features can be separated from each other or spaced apart at a mean distance of from about 10 nm up to about 200 nm. The resulting anti-glare surface can have an average roughness, as measured by the peak-to-valley difference (PV) measure on the surface. In embodiments, the anti-glare surface can have a RMS roughness of about 800 nm, of about 500 nm, and about 100 nm.

The features used to calculate ALF are "characteristic;" i.e., at least twenty similar features can be located in the proportional viewing field. Different morphologies or surface structures can be characterized using ALF. For example, one surface structure may appear to be closed-cell repeating structures, another may appear to be small pits separated by large plateaus, and a third may appear to be a field of small particles punctuated by intermittent large smooth regions. In each instance, the ALF is determined by measuring the twenty largest repeating surface regions that are substantially optically smooth. In the instance of the repeating closed cell surface structure, the features to be measured are the largest of the cells in the closed-cell matrix. For the surface structure comprising small pits separated by large plateaus, the large plateaus between pits are to be measured. For the surface comprising a field of small particles punctuated by intermittent large smooth regions, the intermittent large smooth regions are to be measured. All surfaces with substantially varying morphologies can thus be characterized using ALF.

In embodiments, the at least one roughened surface of the glass article has an average RMS roughness can be from about 10 nm to about 800 nm, from about 40 nm to about 500 nm, and from about 40 nm to about 300 nm. In embodiments, the average RMS roughness can be greater than about 10 nm and less than about 10% of the ALF, greater than about 10 nm and less than about 5% of ALF, and greater than about 10 nm and less than about 3% of ALF.

The specification of low DOI and high Ros/Rs provide constraints on the characteristic feature size and ALF. For a given roughness level, it has been found that larger feature sizes result in lower DOI and higher Ros/Rs. Therefore, to balance the display sparkle and the DOI target, in embodiments, it can be desirable to create anti-glare surfaces having an intermediate characteristic feature size that is neither too small nor too large. It is also desirable to minimize reflected or transmitted haze when the transmitted haze is scattering into very high angles that can cause a milky white appearance of a roughened article under ambient lighting.

"Transmission haze," "haze," or like terms refer to the percentage of transmitted light scattered outside an angular cone of ±4.0° according to ASTM D1003. For an optically smooth surface, the transmission haze is generally close to zero. Transmission haze of a glass sheet roughened on two sides ($Haze_{2\text{-}side}$) can be related to the transmission haze of a glass sheet having an equivalent surface that is roughened on only one side ($Haze_{1\text{-}side}$), according to the approximation of eq. (2):

$$Haze_{2\text{-}side} \approx [(1-Haze_{1\text{-}side}) \cdot Haze_{1\text{-}side}] + Haze_{1\text{-}side} \quad (2).$$

Haze values are usually reported in terms of percent haze. The value of $Haze_{2\text{-}side}$ from eq. (2) must be multiplied by 100. In embodiments, the disclosed glass article can have a transmission haze of less than about 50% and even less than about 30%.

A multistep surface treatment process has been used to form the roughened glass surface. An example of a multistep etch process is disclosed in commonly owned copending U.S. Provisional Patent Appln 61/165,154, filed Mar. 31, 2009, to Carlson, et al., entitled "Glass Having Anti-Glare Surface and Method of Making," where a glass surface is treated with a first etchant to form crystals on the surface, then etching a region of the surface adjacent to each of the crystals to a desired roughness, followed by removing the crystals from the glass surface, and reducing the roughness of the surface of the glass article to provide the surface with a desired haze and gloss.

In embodiments, various performance enhancing additives can be included in the particle suspension, the etch solution, or both, including for example, a surfactant, a co-solvent, a diluent, a lubricant, a gelation agent, and like additives, or combinations thereof.

The contacting with etchant can involve, for example, selective partial or complete dipping, spaying, immersion, and like treatments, or a combination of treatments, with an acidic etch solution including, for example, 2 to 10 wt % hydrofluoric acid and 2 to 30 wt % of a mineral acid, such as hydrochloric acid, sulfuric acid, nitric acid, phosphoric acid, and like acids, or combinations thereof. The glass surface can be etched in the solution for periods of from about 1 to about 10 minutes, with longer times generally leading to a greater reduction in the surface roughness. The disclosed concentrations and etch times are representative of suitable examples. Concentrations and etch times outside the disclosed ranges can also be used to obtain the roughened surface of the glass article albeit potentially less efficiently.

In chemical strengthening, larger alkali metal ions are exchanged for smaller mobile alkali ions near the glass surface. This ion-exchange process places the surface of the glass in compression, allowing it to be more resistant to any mechanical damage. In embodiments, the outer surface of the glass article can optionally be ion-exchanged where smaller metal ions are replaced or exchanged by larger metal ions having the same valence as the smaller ions. For example, sodium ions in the glass can be replaced with larger potassium ions by immersing the glass in a molten salt bath containing potassium ions. The replacement of smaller ions with larger ions creates a compressive stress within the layer. In embodiments, the larger ions near the outer surface of the glass can be replaced by smaller ions, for example, by heating the glass to a temperature above the strain point of the glass. Upon cooling to a temperature below the strain point, a compressive stress is created in an outer layer of the glass. Chemical strengthening of the glass can optionally be performed after the surface roughening treatment, with little negative effect on the ion-exchange behavior or the strength of the glass article.

In embodiments, the disclosure provides a method for making an anti-glare surface including, for example, "particulating" (i.e., populating) the surface with particles, such as with a liquid suspension or a soot gun, etching the particulated surface with a suitable etchant, ion-exchanging the etched surface, and optionally accomplishing further processing to reduce objectionable surface flaws (i.e., flaw reduction). Alternatively or additionally, the surface can be ion-exchanged, particulated with particles, etched with an etchant, and optionally flaw reduction processing.

Figure 1:
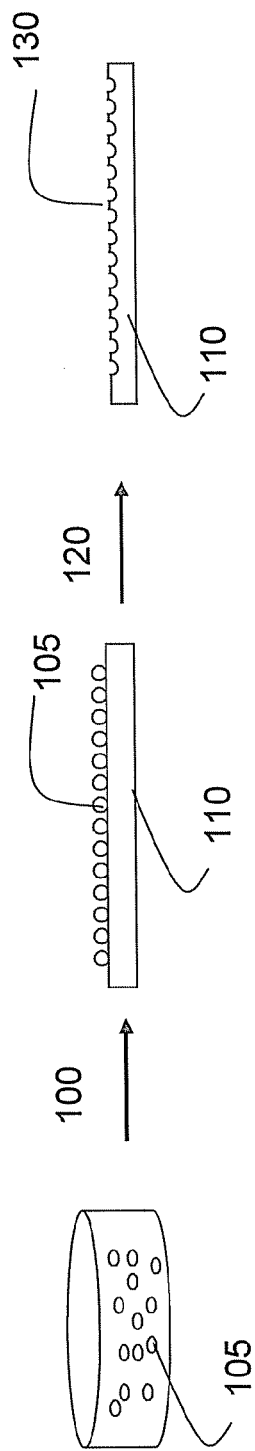
FIG. 1 shows a schematic of the method of making an anti-glare layer on a glass surface.

Referring to the figures, FIG. 1 schematically shows the steps in the process of creating an anti-glare layer on a GORILLA® glass surface. Glass particles having an average size less than about 10 micrometers are suspended in a suitable liquid, and the resulting suspension can be deposited (100), for example, sprayed onto a glass substrate, and the solvent removed to leave a residual layer of glass particles (105) weakly adhered on the glass substrate (110). The sample can then be dipped into or immersed in an acid etch (120) bath. The $HF/H_2SO_4$ etchant attacks the area around the glass particles and eventually under-cuts the area covered by individual particles. The glass particles are liberated from the substrate surface during the etch (120) and thus create a textured surface (130) on the glass substrate having anti-glare properties.

Figure 2B:
FIG. 2b shows a micrograph of a glass surface after etching in acid solution for about 10 minutes to produce an excellent anti-glare surface layer.
Figure 2A:
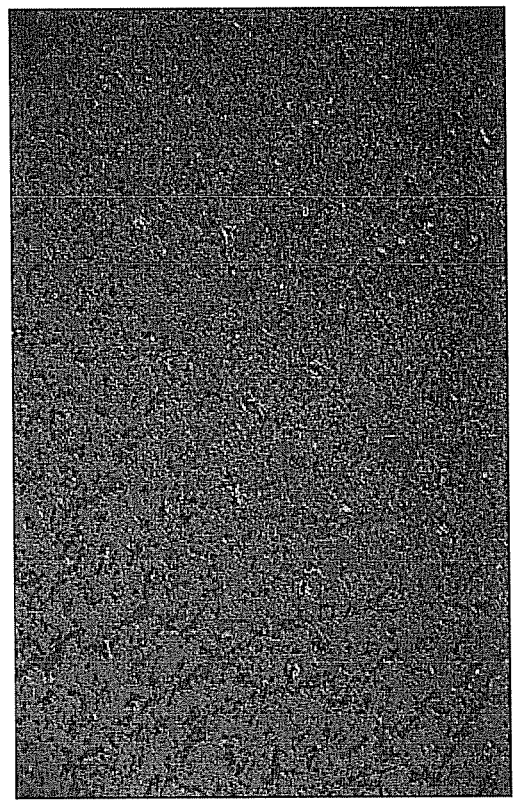
FIG. 2a shows a micrograph of particles that have been spin-coated onto a glass surface and are ready for etching.

FIG. 2a shows a micrograph image of glass particles that have been spin-coated onto a chemically strengthened glass surface (GORILLA® glass from Corning, Inc.) and are ready for etching. $D_{50}$ of 3.5 micrometer glass particles were mixed into suspension then spin-coated on the glass surface.

FIG. 2b shows a micrograph image at 100× magnification of a glass surface after etching in acid solution for about 10 minutes in a 3M $HF$/3.6 M $H_2SO_4$ bath. An excellent anti-glare surface layer was produced. These samples had haze of 3% (target: less than about 10%); distinctness-of-image (DOI) measurement of 59 (target: 50 to 75).

Figure 3:
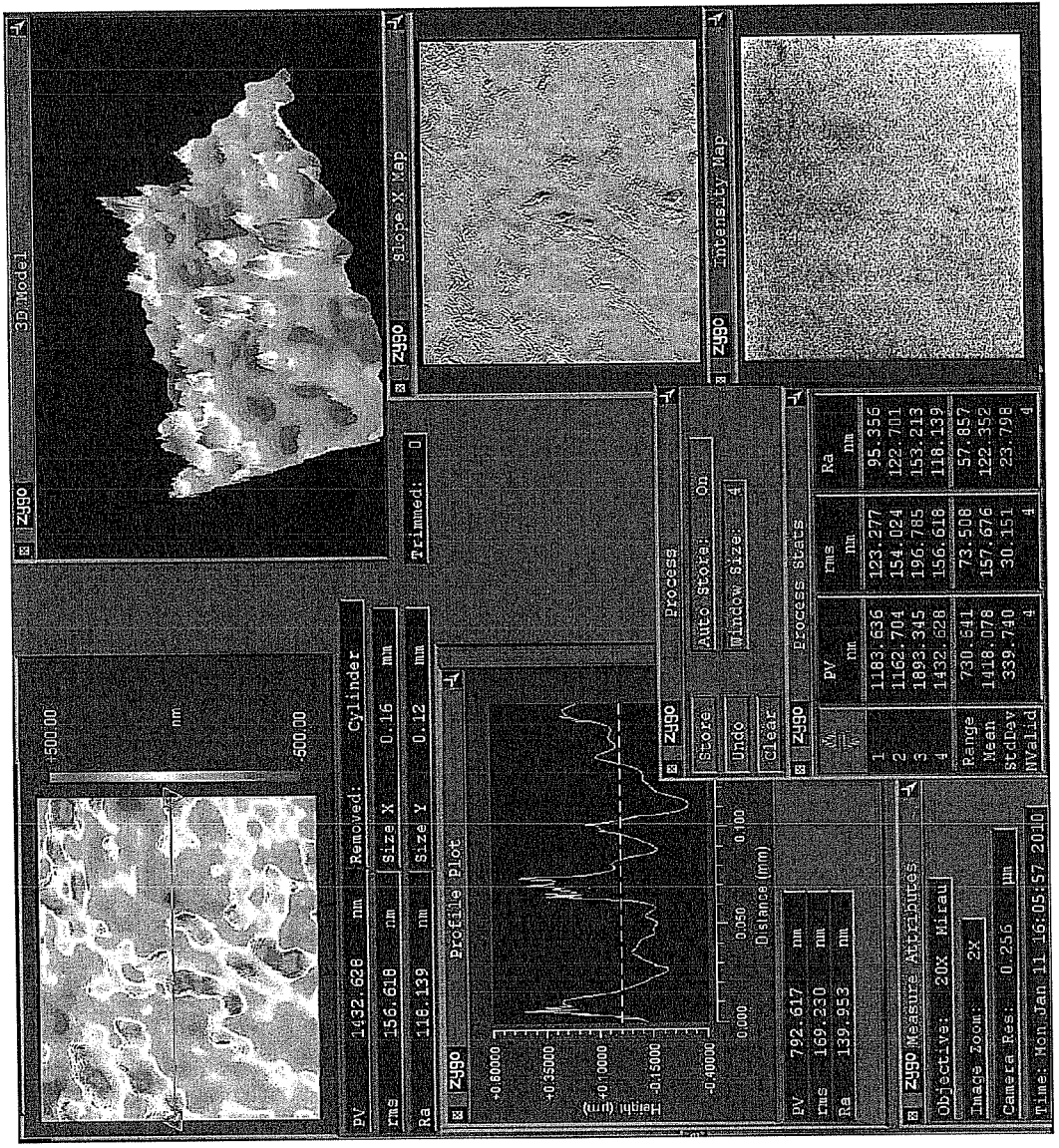
FIG. 3 shows three-dimensional optical surface analysis measurements of the etched sample of FIG. 2b.

FIG. 3 shows the results three-dimensional optical surface analysis measurements and images (Zygo; www.zygo.com) for the etched sample. The mean of peak-to-valley was 1.4 micrometers. The surface roughness (Ra) of about 122 nm is also in the targeted range of about 100 to about 300 nm.

Figure 4:
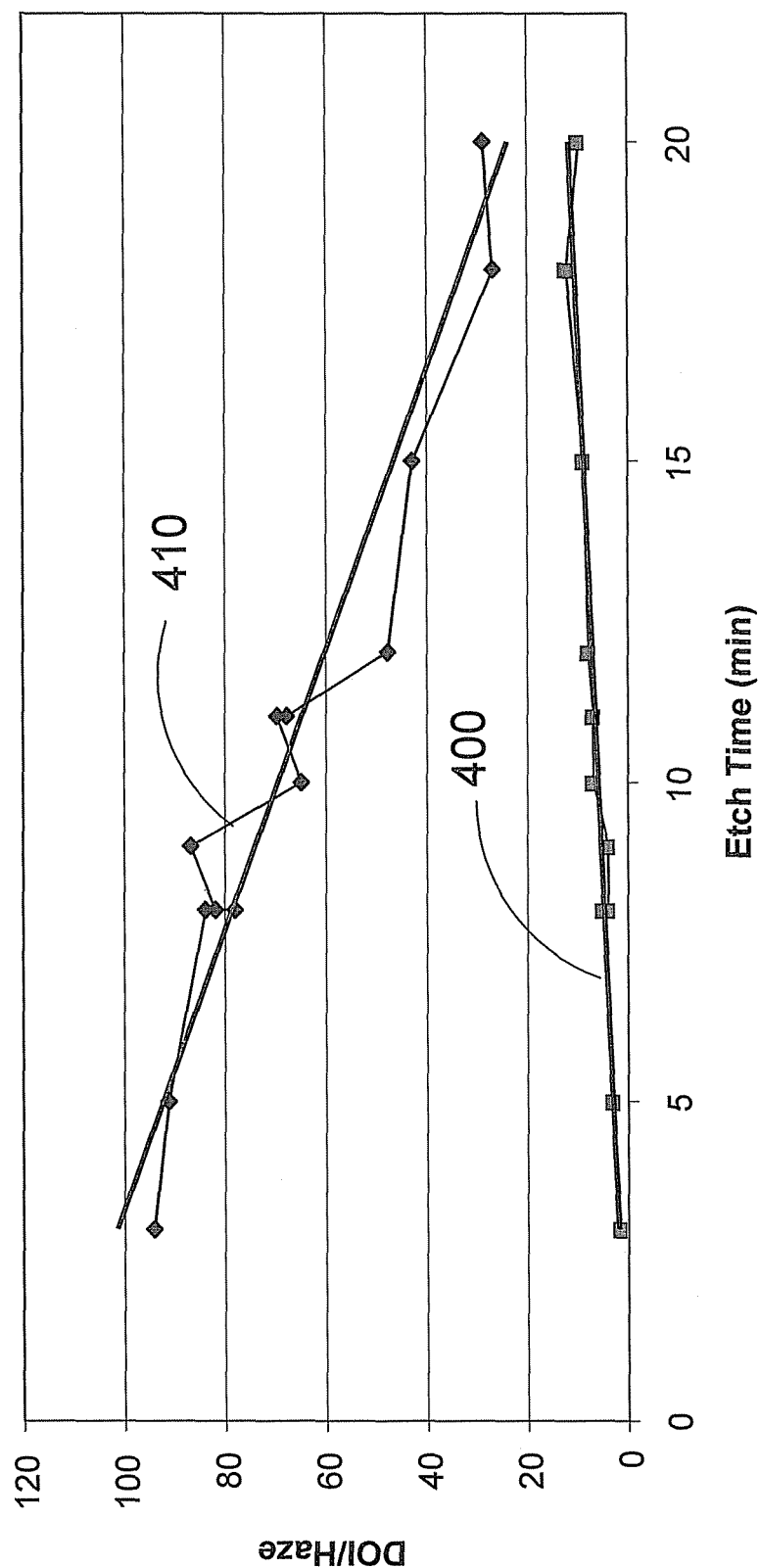
FIG. 4 shows a plot of the haze and DOI plotted against etch time.

FIG. 4 shows a plot of the haze and DOI plotted against etch time. Strong correlations between haze (square data points) and DOI (diamond data points) versus time were demonstrated (haze fitted (400): y=0.5916x+0.0431, and $R^2$=0.9067; DOI fitted (410): y=−4.5689x+115.12 and $R^2$=0.9133). By controlling the etch time, desired DOI, haze, or both can be achieved.

FIGS. 5a and 5b, respectively, show the glass surface before etching and a Zygo profile after etching, for a representative spray-coated sample. In FIG. 5a the dark regions correspond to heavily or densely particulated area, the gray regions correspond to relatively lighter or less densely particulated area, and the white regions correspond to areas void or free-of deposited particulate material.

In embodiments, the disclosed method and article can provide at least one or more of the following advantages. The disclosed etch method can be accomplished quickly, for example, in from about 1 to about 10 minutes, in from about 1 to about 5 minutes, such as in from about 2 to about 4 minutes, to create an anti-glare layer on a glass surface. A conventional multi-bath method can take about 60 minutes or more. The disclosed etch method uses a single chemical etchant bath (e.g., $HF+H_2SO_4$) instead of three or more baths used in conventional processes.

In embodiments, the disclosed method can etch away, for example, from about 1 to about 50 micrometers of the substrate being etched (i.e., into the plane of the substrate or the z-direction), from about 1 to about 30 micrometers of the substrate, from about 1 to about 20 micrometers of the substrate, from about 1 to about 10 micrometers of the substrate, including intermediate values and ranges, to create a desired anti-glare layer. In contrast, a conventional etch process can typically remove about 100 to about 200 micrometers of the glass surface. Since relatively little glass is lost from the glass substrate using the disclosed method, the glass can have a maximum warp of less than about 250 micrometers (see also FIG. 8, and accompanying text). A conventional glass etching process can produce glass surfaces having, for example, about 300 micrometers or more of warp.

Samples prepared with the disclosed process show similar optical properties (e.g., haze, gloss, and distinctness of image (DOI)) when compared with samples etched with a conventional process, but the present method and samples are advantaged by having substantial reductions in process time and costs. The disclosed process is readily scaled-up for large parts, such as a one square meter glass sheet, and above, while a conventional dip process is less readily scalable for larger units.

With a proper design selection, the disclosed process does not need backside protection to make single-sided samples. Single-sided samples can be prepared using for example, single-side dip, spray, or spin coating methods. A multi-bath conventional process needs backside protection film, which can further increase manufacturing costs.

In embodiments, the glass article can comprise, consist essentially of, or consist of one of a soda lime silicate glass, an alkaline earth aluminosilicate glass, an alkali aluminosilicate glass, an alkali borosilicate glass, and combinations thereof. In embodiments, the glass article can be, for example, an alkali aluminosilicate glass having the composition: 60-72 mol % $SiO_2$; 9-16 mol % $Al_2O_3$; 5-12 mol % $B_2O_3$; 8-16 mol % $Na_2O$; and 0-4 mol % $K_2O$, wherein the ratio $$\frac{Al_2O_3(\text{mol }\%) + B_2O_3(\text{mol }\%)}{\sum \text{ alkali metal modifiers (mol }\%)} > 1,$$

where the alkali metal modifiers are alkali metal oxides. In embodiments, the alkali aluminosilicate glass substrate can be, for example: 61-75 mol % $SiO_2$; 7-15 mol % $Al_2O_3$; 0-12 mol % $B_2O_3$; 9-21 mol % $Na_2O$; 0-4 mol % $K_2O$; 0-7 mol % $MgO$; and 0-3 mol % $CaO$. In embodiments, the alkali aluminosilicate glass substrate can be, for example: 60-70 mol % $SiO_2$; 6-14 mol % $Al_2O_3$; 0-15 mol % $B_2O_3$; 0-15 mol % $Li_2O$; 0-20 mol % $Na_2O$; 0-10 mol % $K_2O$; 0-8 mol % $MgO$; 0-10 mol % $CaO$; 0-5 mol % $ZrO_2$; 0-1 mol % $SnO_2$; 0-1 mol % $CeO_2$; less than 50 ppm $As_2O_3$; and less than 50 ppm $Sb_2O_3$; wherein 12 mol %≤$Li_2O+Na_2O+K_2O$ 20 mol % and 0 mol % $MgO+CaO$≤10 mol %. In embodiments, the alkali aluminosilicate glass substrate can be, for example: 64-68 mol % $SiO_2$; 12-16 mol % $Na_2O$; 8-12 mol % $Al_2O_3$; 0-3 mol % $B_2O_3$; 2-5 mol % $K_2O$; 4-6 mol % $MgO$; and 0-5 mol % $CaO$, wherein: 66 mol % $SiO_2+B_2O_3+CaO$ 69 mol %; $Na_2O+K_2O+B_2O_3+MgO+CaO+SrO$>10 mol %; 5 mol % $MgO+CaO+SrO$≤8 mol %; ($Na_2O+B_2O_3$)—$Al_2O_3$≤2 mol %; 2 mol % $Na_2O$—$Al_2O_3$≤6 mol %; and 4 mol % ($Na_2O+K_2O$)—$Al_2O_3$ 10 mol %. In embodiments, the alkali aluminosilicate glass can be, for example: 50-80 wt % $SiO_2$; 2-20 wt % $Al_2O_3$; 0-15 wt % $B_2O_3$; 1-20 wt % $Na_2O$; 0-10 wt % $Li_2O$; 0-10 wt % $K_2O$; and 0-5 wt % ($MgO+CaO+SrO+BaO$); 0-3 wt % ($SrO+BaO$); and 0-5 wt % ($ZrO_2+TiO_2$), wherein 0 ($Li_2O+K_2O$)/$Na_2O$≤0.5. In embodiments, the alkali aluminosilicate glass can be, for example, substantially free of lithium. In embodiments, the alkali aluminosilicate glass can be, for example, substantially free of at least one of arsenic, antimony, barium, or combinations thereof. In embodiments, the glass can optionally be batched with 0 to 2 mol % of at least one fining agent, such as $Na_2SO_4$, $NaCl$, $NaF$, $NaBr$, $K_2SO_4$, $KCl$, $KF$, $KBr$, $SnO_2$, at like substances, or combinations thereof.

In embodiments, the selected glass can be, for example, down drawable, i.e., formable by methods such as slot draw or fusion draw processes that are known in the art. In these instances, the glass can have a liquidus viscosity of at least 130 kpoise. Examples of alkali aluminosilicate glasses are described in commonly owned and assigned U.S. patent application Ser. No. 11/888,213, to Ellison, et al., entitled "Down-Drawable, Chemically Strengthened Glass for Cover Plate," filed Jul. 31, 2007, which claims priority from U.S. Provisional Application 60/930,808, filed May 22, 2007; U.S. patent application Ser. No. 12/277,573, to Dejneka, et al., entitled "Glasses Having Improved Toughness and Scratch Resistance," filed Nov. 25, 2008, which claims priority from U.S. Provisional Application 61/004,677, filed Nov. 29, 2007; U.S. patent application Ser. No. 12/392,577, to Dejneka, et al., entitled "Fining Agents for Silicate Glasses," filed Feb. 25, 2009, which claims priority from U.S. Provisional Application No. 61/067,130, filed Feb. 26, 2008; U.S. patent application Ser. No. 12/393,241, to Dejneka, et al., entitled "Ion-Exchanged, Fast Cooled Glasses," filed Feb. 26, 2009, which claims priority to U.S. Provisional Application No. 61/067,732, filed Feb. 29, 2008; U.S. patent application Ser. No. 12/537,393, to Barefoot, et al., entitled "Strengthened Glass Articles and Methods of Making," filed Aug. 7, 2009, which claims priority to U.S. Provisional Application No. 61/087,324, entitled "Chemically Tempered Cover Glass," filed Aug. 8, 2008; U.S. Provisional Patent Application No. 61/235,767, to Barefoot, et al., entitled "Crack and Scratch Resistant Glass and Enclosures Made Therefrom," filed Aug. 21, 2009; and U.S. Provisional Patent Application No. 61/235,762, to Dejneka, et al., entitled "Zircon Compatible Glasses for Down Draw," filed Aug. 21, 2009.

The glass surfaces and sheets described in the following example(s) can use any suitable particle-coatable and etchable glass substrate or like substrates, and can include, for example, a glass composition 1 through 11, or a combination thereof, listed in Table 5.

EXAMPLES

The following examples serve to more fully describe the manner of using the above-described disclosure, and to further set forth the best modes contemplated for carrying out various aspects of the disclosure. It is understood that these examples do not limit the scope of this disclosure, but rather are presented for illustrative purposes. The working examples further describe how to prepare the articles of the disclosure.

Preparation of Particulated Surfaces

Example 1

Preparation of Particle Suspensions

Particle suspension masks were prepared by dispersing less than about 10% by weight of glass powders in a volatile liquid or solvent binder containing optional additives. The examples were demonstrated with glass powder particulates. Other substitute or supplemental particulates, such as inorganic or like particulates, can be selected to achieve a similar, desired effect. For additional definitions, descriptions, and methods of particulate silica materials, including particle size-solubility relationships, and related metal oxide materials, see for example, R. K. Iler, *The Chemistry of Silica*, Wiley-Interscience, 1979.

The volatile liquid or solvent was evaporated in air or with accelerated drying methods, such as vacuum, mild heating, or combinations thereof. The residual surface layer of the glass particulates partially protects underlying or supporting portions of the glass substrate surface, so that during acid etching not all of the substrate is etched away. Particulate suspension preparation can include, for example, a two step process comprising, for example, preparing a concentrate stock suspension, and then prior to surface application, the concentrate can be reduced in concentration or let-down by adding (diluting) a volatile liquid that can readily evaporate after application. In embodiments, the dilute suspension is stable for a period of, for example, several days to weeks, and can be re-suspended by rolling or shaking.

The concentrated glass suspension can be prepared and rolled to minimize particle settling. The concentrate, prior to application, can be diluted at different ratios of concentrate with a volatile liquid diluent, such as water or an organic solvent, to provide different concentrations of particles in the suspensions. The different concentrations of particle suspension can provide a straightforward method to prepare different levels of particle coverage on the substrate. The higher the ratio of concentrate to volatile liquid, the more particles that will be present on the substrate's surface after surface application, for example, by spin-coating. However, particle depositions or particle applications to the surface can be further improved by, for example, spray-coating, or using other methods including, for example, slot-coating, dip-coating, depositing glass soot, jetting molten glass particles, and like methods.

Preparation of the glass suspension or slurry concentrate can be accomplished, for example, by weighing the components, hand mixing by shaking, and then running the suspension through a bead/ball mill (mill time, at for example 2, 400 rpm, for a 100 cc formulation was 30 minutes with a 75% charge of 1 mm yttria-stabilized zirconia particles) to eliminate particle agglomeration. A rheology modifier can be added to keep particles suspended in the slurry. Byk 420 was used to develop a reversible three-dimensional network, and can be added, for example, during the final 15 minutes of mixing to increase the slurry viscosity and to reduce particle settling. The concentrated slurry was placed on rollers to maintain the particle suspension. The suspension prior to substrate application may need to be reduced or diluted to a lower particle concentration. It was found that for certain of the spin-coating applications, slurries having a glass particle content of about 5 to about 10 wt. % resulted in acceptable properties for haze, roughness, and DOI. For these experiments the concentrate dilution was accomplished with isopropyl alcohol and an additional rheology modifier was added. Other volatile solvents can be used such as ethanol, and like liquids, or combinations thereof. The suspension can be mixed at different ratios. It was found that 6 parts of concentrate to 24 parts by weight isopropyl alcohol (IPA) (a 1:4 ratio) gave acceptable results. Other acceptable mix ratios were 6 to 18 (1:3 ratio), and 6 to 12 (1:2 ratio). As the ratio of concentrate to solvent was reduced below these levels, such as a ratio less than about 1:1.5 to about 1:1, a significant change in surface roughness occurs and haze levels fell out of the acceptable range.

The density of the glass particles used was about 2.2 g/cc. The density of the reduced suspension medium was about 0.98 g/cc. Glass particles may tend to settle rapidly. Therefore, a rheology modifier (Byk 420, a modified urea in N-methylpyrrolidone) was added and dispersed by placing the suspension on a paint shaker for about 10 minutes to keep the glass particles well suspended during surface application. Table 1 provides a summary of several exemplary formulations developed.

TABLE 1

Representative glass particle suspension formulations.

| | | Fritted Powder Suspension | | | |
|---|---|---|---|---|---|
| Ingredient | Wt. % | 1:4 dilution w/IPA diluent Wt. % | 1:3 dilution w/IPA diluent Wt. % | 1:2 dilution w/IPA diluent Wt. % | 1:4 dilution w/IPA diluent and 420[4] mod. Wt. % |
| Ethanol | 12.10 | 9.75 | 12.10 | 15.96 | 9.5 |
| Glass particles[1] | 43.06 | 9.54 | 11.84 | 15.62 | 9.32 |
| Medium 80 863 (Binder)[2] | 9.13 | 2.02 | 2.51 | 3.32 | 1.98 |
| Disperbyk[3] | 1.72 | 0.38 | 0.47 | 0.62 | 0.37 |
| BYK 420[4] | 2.08 | 0.46 | 0.57 | .75 | 2.76 |
| Isopropyl alcohol (IPA) | — | 77.9 | 72.50 | 63.8 | 76.05 |
| TOTAL | 100 | 100 | 100.0 | 100.0 | 100.0 |

[1]alumino-borosilicate particles with a $D_{50}$ of 3.5 micrometers.
[2]Medium 80 683 (a binder from Ferro; 8% cellulose derivative in mixed solvent; denatured ethanol, ca. 40 wt %, diethylene glycol monomethylether, ca. 60 wt %).
[3]Disperbyk, from Byk Chemie, is carboxylic acid copolymer wetting and dispersing additive. Disperbyk per se was used in these formulations.
[4]Byk 420, from Byk Chemie, is a thixotropic rheology modifier consisting of a modified urea in N-methylpyrrolidone.

Exemplary glass compositions used for particle suspension and deposition were, for example, alumino-borosilicates with a $D_{50}$ of 3.5 micrometers. Other glass particle sizes, glass particle compositions, or glass substrates may involve additional or further formulation manipulation to produce finished substrates having the desired roughness, haze level, and DOI properties in the finished article.

Other glass particles that can be used and that were examined include, for example, alumino-borosilicate glasses having a $D_{50}$ of 0.7 micrometers and 14 micrometers, and soda-lime glasses having a $D_{50}$ of 3.5 micrometers, see data in FIGS. 6 and 7. In embodiments, the glass particles can be used at any suitable suspension concentration, for example, from about 1 vol % to about 15 vol %, from about 2 vol % to about 10 vol %, from about 3 vol % to about 10 vol %, including intermediate values and ranges.

Example 2

Preparation of Particle Suspensions-One Step Preparation

Example 1 was repeated with the exceptions that the particle suspension concentration was greater, and the dispersion apparatus selected was more energetic. The particle suspension prepared and used was a concentrate, that is, the suspension was not diluted (let down) in a second dilution step. When the particle suspension concentration selected was, for example, from about 10 to about 25 wt % (that is greater than in Example 1), or smaller average size particles were selected, or both, a bead mill could be used to prepare the liquid suspension more efficiently and the resulting suspension(s) having greater stability. Table 2 summarizes glass particle suspension formulations that were prepared and that were found to have superior stability or surface particulation properties. Table 3 summarizes other representative glass particle suspension formulations that were prepared and from which the superior formulations in Table 2 were.

TABLE 2

Superior particle suspension formulations.

| Components by Wt. % | A | B | C | D | E |
|---|---|---|---|---|---|
| Aquazol 200 | — | — | 1 | — | — |
| medium 806 83 | 1.5 | 12.2 | — | 13.7 | 12.3 |
| ethanol | 10.6 | 60.3 | — | 66.3 | 60.25 |
| isopropanol | 78.0 | — | — | — | — |
| water | — | — | 65.0 | — | — |
| propylene glycol | — | — | 11.7 | — | — |
| Disperbyk | 0.3 | 0.5 | — | 0.5 | 0.5 |
| Alcosperse 149 (acrylate dispersant for aqueous systems; Akzo-Nobel) | — | — | 0.5 | — | — |
| Byk 420(non-polar rheology modifier) | 1.1 | 2.0 | 0.3 | 1.0 | 2.0 |
| Alumino-borosilicate ($D_{50}$ 3.5 microns) | 8.2 | 25.0 | — | — | — |
| Soda Lime ($D_{50}$ 3.5 microns) | — | — | 21.6 | 18.4 | — |
| Potters EM-10 glass beads | — | — | — | — | 25 |
| Total | 100 | 100 | 100 | 100 | 100 |

TABLE 3

Particle suspension formulations.

| Components Wt. % | F | G | H | I | J |
|---|---|---|---|---|---|
| Cellulose derivative binder[1] (Ferro) | 1.1 | — | — | 1.0 | — |
| Butvar 98 (polyvinyl butryl resin; Solutia) | — | 1.0 | 0.5 | — | — |
| Aquazol 200 (water based binder poly(2-ethyl-2-oxazoline); from Polychemistry Innovations | — | — | — | — | 1 |
| Medium 806 83 solvent blend[1] | 11.5 | — | — | 11.5 | — |
| ethanol | 61.2 | 8.8 | 7.3 | 7.5 | — |
| isopropanol | — | — | — | 54.0 | — |
| water | — | — | — | — | 64.8 |
| xylene | — | 40.2 | 32.7 | — | — |
| butanol | — | 20.2 | 16.4 | — | — |
| butyl cellosolve | — | 19.0 | 16.4 | — | — |
| propylene glycol | — | — | — | — | 11.7 |
| Disperbyk | 0.6 | 0.3 | 0.5 | 0.6 | 0.5 |
| Alcosperse 149 | 0.6 | — | — | — | — |
| Byk 420 | — | 1.4 | 2.7 | — | 0.53 |
| Cabosil TS 720 | — | — | — | 1.1 | — |
| 723 dm ($D_{50}$ 3.5 microns) | — | 9.3 | — | — | — |
| Soda Lime ($D_{50}$ 3.5 microns) | — | — | 23.6 | 24.8 | 21.36 |
| Soda lime ($D_{50}$ 0.9 microns) | 25 | — | — | — | — |
| Total | 100 | 100 | 100 | 100 | 100 |

[1]Medium 80 683 (a binder from Ferro; 8% cellulose derivative in mixed solvent; denatured ethanol, ca. 40 wt %, diethylene glycol monomethylether, ca. 60 wt %).

Example 3

Particle Suspension Spray Deposition on a Surface

The particle suspensions of Examples 1 and 2 were deposited on selected glass surfaces by spray coating one or both sides of a glass sheet according to the conditions and settings listed in the accompanying Table.

| Spray Condition | Setting |
| --- | --- |
| Nozzle opening diameter (mm) | 0.76 |
| Flute (degree) | 10 |
| Air assist (psi) | 85 |
| Fluid pressure (psi) | 15 |
| Dispense height (inches) | 3 |
| Speed (inches/sec) | 27 |
| Stroke (mils) | 3.8 |
| Pass width (in) | 0.10 |
| Number of Passes | 1 |

Example 4

Particle Suspension Dip Deposition on a Surface

The particle suspensions of Examples 1 and 2 were deposited on selected glass surfaces by dip coating on one or both sides of a glass sheet according to the conditions and settings listed in the accompanying Table.

| Dip Condition | Setting |
| --- | --- |
| speed down (mm/sec) | 20 |
| speed up (mm/sec) | 10 |
| dwell time (seconds) | 7 |

Etching Particulated Surfaces

Example 5

Immersion Etch of Particulated Surfaces

Glass sheets having particulated glass surfaces prepared in Examples 3 or 4 were etched using various acid formulations with controlled variation in etch time and temperature according to Example 1 were etched using various acid formulations with controlled variation in etch time and temperature, for example, an etch time of 5 minutes, acids concentration of 3 M HF and 3.6 M $H_2SO_4$, at ambient (25° C.) temperature, and like conditions.

Table 4 presents anti-glare optical properties of six spin-coated samples that were etched by immersion with the specified etch time (min) in a mixture of 3M HF and 3.6 M $H_2SO_4$. The samples all had haze and DOI within the target ranges. The samples also appeared uniform a defined herein.

TABLE 4

Glare properties of spin-coated and immersion etched samples

| Etch time (min) | Haze | Distinctness-of-Image (DOI) | Uniformity Rating[1] |
| --- | --- | --- | --- |
| 6 | 1.25 | 63.6 | OK |
| 3 | 3.6 | 54.6 | good |
| 6 | 1.4 | 55.9 | good |
| 9 | 8.2 | 44.3 | good |
| 4 | 1.3 | 65.5 | good |
| 5 | 3.6 | 57 | good |

[1] "Good": no defect(s) can be detected by the observer; "OK": several of minor or tiny spots can be seen by a trained observer.

Even if the samples were etched for only about three minutes in the HF/$H_2SO_4$ solutions, optical properties that meet the target could still be achieved. This demonstrates that glass particles can be used as a temporary and partial microscopic or sub-microscopic mask layer to create an anti-glare surface. The method is faster and cheaper, while still retaining all the desired optical properties, compared with a conventional three bath-etch process.

Table 5 shows anti-glare optical properties of another set of samples that were particulate coated by spraying the glass particle suspensions on to one-side of the glass substrate followed by the indicated acid etch immersion time(s) in 3M HF and 3.6 M $H_2SO_4$.

TABLE 5

Anti-glare optical properties of single-side particulate treatment.

| Sample | Etch Time (min) | DOI | Haze |
| --- | --- | --- | --- |
| 1 | 3 | 94 | 1.5 |
| 2 | 5 | 91 | 2.8 |
| 3 | 8 | 84 | 5 |
| 4 | 8 | 78 | 5 |
| 5 | 8 | 82 | 4 |
| 6 | 9 | 87 | 4 |
| 7 | 10 | 65 | 6.9 |
| 8 | 11 | 70 | 7 |
| 9 | 11 | 68 | 7 |
| 10 | 12 | 48 | 8 |
| 11 | 15 | 43 | 9 |
| 12 | 18 | 27 | 12 |
| 13 | 20 | 29 | 10 |

Table 6 provides coating conditions, etch conditions, and results obtained from applying a glass particle suspension by spraying onto two separate 10"×14" glass sheets to demonstrate process scalability and uniformity. Each glass sheet had a different coating condition but each sheet exhibited good AG results. For coating condition 1, the sample suspension was sprayed at rate of 15 inches per sec using, for example, a commercially available Asymtek spray system (Asymteck.com) with a stroke setting of 3. For coating condition 2, the sample suspension was sprayed at 15 inches per sec with the stroke of 4.

TABLE 6

Process conditions and anti-glare results for larger glass sheets.

| Coating Condition | Glass size | Etch Time (min) | Haze | DOI | Uniformity |
| --- | --- | --- | --- | --- | --- |
| 1 | 10" × 14" | 10 | 6 | 70 | good |
| 2 | 10" × 14" | 10 | 8 | 40 | good |

The glass surfaces and sheets described in the above example can use any suitably coatable and etchable glass substrate, or like substrates, including for example, the glass compositions 1 through 11 listed in Table 7.

TABLE 7

Representative glass substrate compositions.

| Glass> Oxides (mol %) | 1 | 2 | 3 | 4 | 5 | 6 | 7 | 8 | 9 | 10 | 11 |
|---|---|---|---|---|---|---|---|---|---|---|---|
| $SiO_2$ | 66.16 | 69.49 | 63.06 | 64.89 | 63.28 | 67.64 | 66.58 | 64.49 | 66.53 | 67.19 | 70.62 |
| $Al_2O_3$ | 10.29 | 8.45 | 8.45 | 5.79 | 7.93 | 10.63 | 11.03 | 8.72 | 8.68 | 3.29 | 0.86 |
| $TiO_2$ | 0 | — | — | — | — | 0.64 | 0.66 | 0.056 | 0.004 | — | 0.089 |
| $Na_2O$ | 14 | 14.01 | 15.39 | 11.48 | 15.51 | 12.29 | 13.28 | 15.63 | 10.76 | 13.84 | 13.22 |
| $K_2O$ | 2.45 | 1.16 | 3.44 | 4.09 | 3.46 | 2.66 | 2.5 | 3.32 | 0.007 | 1.21 | 0.013 |
| $B_2O_3$ | 0.6 | — | 1.93 | — | 1.9 | — | — | 0.82 | — | 2.57 | — |
| $SnO_2$ | 0.21 | 0.185 | — | — | 0.127 | — | — | 0.028 | — | — | — |
| BaO | 0 | — | — | — | — | — | — | 0.021 | 0.01 | 0.009 | — |
| $As_2O_3$ | 0 | — | — | — | — | 0.24 | 0.27 | — | — | 0.02 | — |
| $Sb_2O_3$ | — | — | 0.07 | — | 0.015 | — | 0.038 | 0.127 | 0.08 | 0.04 | 0.013 |
| CaO | 0.58 | 0.507 | 2.41 | 0.29 | 2.48 | 0.094 | 0.07 | 2.31 | 0.05 | 7.05 | 7.74 |
| MgO | 5.7 | 6.2 | 3.2 | 11.01 | 3.2 | 5.8 | 5.56 | 2.63 | 0.014 | 4.73 | 7.43 |
| $ZrO_2$ | 0.0105 | 0.01 | 2.05 | 2.4 | 2.09 | — | — | 1.82 | 2.54 | 0.03 | 0.014 |
| $Li_2O$ | 0 | — | — | — | — | — | — | — | 11.32 | — | — |
| $Fe_2O_3$ | 0.0081 | 0.008 | 0.0083 | 0.008 | 0.0083 | 0.0099 | 0.0082 | 0.0062 | 0.0035 | 0.0042 | 0.0048 |
| SrO | — | — | — | 0.029 | — | — | — | — | — | — | — |

FIG. 6 shows results for a study of etch time v. DOI and Haze properties for surface preparations made with smaller glass particle size ($D_{50}$ of 0.7 micrometers). The plot of the haze (610, square data points) and DOI (600, diamond data points) against etch time shows that as the etch time increases, the DOI decreased while the haze increased. This was similar to the trend that was observed for particles having $D_{50}$ of 3.5 micrometers in FIG. 4. By controlling the etch time, the desired DOI, haze, or both can be achieved.

FIG. 7 shows results of a study of etch time v. DOI and Haze properties for a soda lime glass were particulated with glass particles having larger particle sizes ($D_{50}$ of 3.5 micrometers) compared to particles used in obtaining the FIG. 6 results.

The plot shows that the etch time is still a significant control parameter for both haze (diamond data points) and DOI (square data points). As the etch time increased, the DOI decreased and the haze increased.

Post Etch Processing

Example 5

Optional Ion Exchange

Both etched and control samples were processed through the glass strengthening ion-exchange (10x) step (see the above mentioned ion-exchange documents). FIG. 8 shows results of a warp study on eight inch square (8"×8") glass sheets. Sheet numbers 2 to 10 were measured before and after the etching step on a Flat Master system (large square data points for before etch; small square data points for 8 minutes after etch; "+" sign data points for after ion-exchange, respectively). Sheet numbers 11 to 16 were controls (no etch) (dots and "*" data points are for Flat Master samples referred to as FM#1 and #2, respectively). The plot shows no major changes for warp after the etch step. In general, warp level increased slightly after the ion-exchange step. However, both the etched and the control samples showed equivalent warp level that was still less than 300 microns. This demonstrates that the disclosed process produces comparatively less sheet warp.

Example 6

Optional Flaw Reduction

If desired the etched surface can optionally be further processed to remove surface flaws or defects from the surface and to further enhance the strength, toughness or scratch resistance, and appearance properties of the surface (see for example, commonly owned and assigned U.S. Provisional Patent Application 61/293,032, filed Jan. 7, 2010, entitled "Impact-Damage-Resistant Glass Sheet") Thus, a glass sheet including at least one acid-etched surface as disclosed herein, alone or in combination with a tempering surface compression layer, is subjected to a combination of a surface tempering treatment and then an additional acidic etch treatment. The resulting glass sheet exhibits high strength (ball drop) and is a useful component in damage-resistant consumer display devices.

Example 7

Process Variant 1

An anti-glare surface is prepared according to the following procedure. A glass surface is particulated with by spraying the surface with a liquid suspension containing glass particles. Alternatively, the glass surface is particulated by spraying the surface with glass particles using, for example, a soot gun. The particulated surface is etched with a suitable etchant such as containing fluoride ions. The etched surface is ion-exchanged in a liquid bath. The ion-exchanged surface is optionally subjected to further processing, such as chemical or mechanical contact, to accomplish flaw reduction.

Example 8

Process Variant 2

An alternative process for preparing an anti-glare surface can be accomplished as follows. The glass surface can be first ion-exchanged, then particulated with particles according to any of the above mentioned or referenced techniques. The particulated surface is etched with a suitable etchant, and then the resulting etched surface and optionally be further processed for surface flaw reduction.

Process Variant 3

An anti-glare surface is prepared according to the following procedure. A glass surface is particulated by spraying the surface with a liquid suspension containing polymer particles. Alternatively, the glass surface is particulated by slot coating the surface with a liquid suspension of the polymer particles, or like particle formulation. The particulated surface is sprayed with a suitable etchant, such as containing fluoride ions, to etch the glass surface. The etched surface is ion-exchanged in a liquid bath. The ion-exchanged surface is optionally subjected to further processing, such as chemical or mechanical contact, to accomplish flaw reduction.

Process Variant 4

An anti-glare surface is prepared according to the following procedure. A glass surface is particulated by spraying the surface with a liquid suspension containing polymer particles. The particulated surface is flooded with a suitable etchant such as containing fluoride ions to etch the glass surface The etched surface is optionally subjected to further processing, such as chemical or mechanical contact, to accomplish flaw reduction.

Example 9

Polymer Particle Formulations

Table 8 provides a summary of several exemplary polymer particle formulations.

TABLE 8

Representative polymer particle suspension formulations.

| Formulation component (wt %) | 1 | 2 | 3 |
|---|---|---|---|
| Medium 80 863 | 11.48 | 11.48 | 11.48 |
| Solvent blend[1] | | | |
| Ethanol | 70.86 | 70.86 | 70.86 |
| Disperbyk[2] | 0.31 | 0.31 | 0.31 |
| BYK 420[3] | 2.04 | 2.04 | 2.04 |
| Polymer particle @ 8 micrometers | 15.28 | | |
| Polymer particle @ 12 micrometers | | 15.28 | |
| Polymer particle @ 20 micrometers | | | 15.28 |
| Total | 100 | 100 | 100 |

[1]Medium 80 683 (a binder from Ferro; 8% cellulose derivative in mixed solvent; denatured ethanol, ca. 40 wt %, diethylene glycol monomethylether, ca. 60 wt %).
[2]Disperbyk, from Byk Chemie, is carboxylic acid copolymer wetting and dispersing additive. Disperbyk per se was used in these formulations.
[3]Byk 420, from Byk Chemie, is a thixotropic rheology modifier consisting of a modified urea in N-methylpyrrolidone.
[4]Polymer particle is a copolymer of methylmethacrylate and ethyleneglycoldimethacrylate purchased from Sekisui Products LLC.

Exemplary particle compositions used for particle suspension and deposition were, for example, a copolymer of methyl methacrylate and ethylene glycol dimethacrylate. Other polymer particle sizes, particle compositions, mixing two or more particle sizes with same or different compositions together, or glass substrates may involve additional or further formulation manipulation to produce finished substrates having the desired roughness, haze level, and DOI properties in the finished article.

Example 10

Particle Suspension Spray Deposition on a Surface

The particle suspensions in Table 8 above were deposited on selected glass surfaces by spray coating one or both sides of a glass sheet according to the conditions and settings listed in the Table 9.

TABLE 9

Suspension spray coating conditions and settings.

| Condition | Setting |
|---|---|
| Nozzle opening diameter (mm) | 0.76 |
| Flute (degree) | 10 |
| Air assist (psi) | 80 |
| Fluid pressure (psi) | 10 |
| Dispense height (inches) | 3 |
| Speed (inches/sec) | 20 |
| Stroke (mils) | 7 |
| Pass width (in) | 0.25 |
| Number of Passes | 1 |

Etching Particulated Surfaces

Example 11

Immersion Etch of Particulated Surfaces

Glass sheets having particulated glass surfaces prepared in Examples 9 or 10 were etched using various acid formulations with controlled variation in etch time and temperature. The tables below show the etching conditions and optical properties.

TABLE 10

Anti-glare properties of spray-coated and immersion etched samples.

| Particle size (microns) | Etch time (secs) | Acid Conentration (M HF/M $H_2SO_4$) | Haze | Distinctness-of-Image (DOI) | Uniformity Rating[1] |
|---|---|---|---|---|---|
| 12 | 25 | 5/6 | 5.1 | 32 | good |
| 12 | 20 | 5/6 | 4.5 | 37 | good |
| 12 | 15 | 5/6 | 4.5 | 32 | good |
| 12 | 10 | 5/6 | 3.2 | 46 | good |

[1]"Good": no defect(s) can be detected by the observer; "OK": several of minor or tiny spots can be seen by a trained observer.

Even if the samples were etched for only 10 seconds in the $HF/H_2SO_4$ solutions, optical properties that meet the target still be achieved. This demonstrates that polymer particles can be used as a temporary and partial microscopic or sub-microscopic mask layer to create an anti-glare surface. The method is faster and cheaper, while still retaining all the desired optical properties, compared with a conventional three bath-etch process.

Table 11 shows more anti-glare optical properties that were particulate coated by spraying the 20 micron polymer particle suspensions on to one-side of the glass substrate followed by the indicated acid etch immersion.

TABLE 11

| Particle size (microns) | Etch time (secs) | Acid Concentration (M HF/M $H_2SO_4$) | Haze | Distinctness-of-Image (DOI) | Uniformity Rating[1] |
|---|---|---|---|---|---|
| 20 | 30 | 5/6 | 7.9 | 29 | good |
| 20 | 30 | 5/5.8 | 10.1 | 29 | good |
| 20 | 30 | 5/5.6 | 3.5 | 31 | good |
| 20 | 30 | 5/5.5 | 0.5 | 56 | good |

Table 12 shows more anti-glare optical properties that were particulate coated by spraying the 8 micron polymer particle suspensions on to one-side of the glass substrate followed by the indicated acid etch immersion.

TABLE 12

| Particle size (microns) | Etch time (secs) | Acid Concentration (M HF/M H$_2$SO$_4$) | Haze | Distinctness-of-Image (DOI) | Uniformity Rating[1] |
|---|---|---|---|---|---|
| 8 | 30 | 5/6 | 6 | 27 | good |
| 8 | 30 | 5/5.8 | 3.5 | 28 | good |
| 8 | 30 | 5.6 | 2.3 | 34 | good |
| 8 | 30 | 5/5 | 0.37 | 66 | good |

Table 13 shows more anti-glare optical properties that were particulate coated by spraying the 12 micron polymer particle suspensions on to one-side of the glass substrate followed by the indicated acid etch immersion.

TABLE 13

| Particle size (micron) | Etch time (secs) | Acid Concentration (M HF/M H$_2$SO$_4$) | Haze | Distinctness-of-Image (DOI) | Uniformity Rating[1] |
|---|---|---|---|---|---|
| 12 | 30 | 6/7 | 12 | 26 | good |
| 12 | 30 | 6/7 | 12 | 26 | good |
| 12 | 30 | 6/7 | 13 | 26 | good |
| 12 | 30 | 6/7 | 11.4 | 27 | good |
| 12 | 30 | 6/7 | 11 | 26 | good |

Table 14a shows anti-glare samples made on larger glass sheets (10"×14"). Table 14b lists the spray conditions used for etched samples in Table 14a.

TABLE 14a

| Particle size (micron) | Etch time (secs) | Acid Concentration (M HF/M H$_2$SO$_4$) | Haze | Distinctness-of-Image (DOI) | Uniformity Rating[1] |
|---|---|---|---|---|---|
| 20 | 30 | 5.5/6.1 | 1.8 | 37 | good |
| 20 | 30 | 5.5/6.1 | 1.8 | 43 | good |

TABLE 14b

| Spray Condition | Setting |
|---|---|
| Nozzle (mm) (opening diameter) | 0.76 |
| Flute (degree) | 10 |
| Air Assist (psi) | 80 |
| Fluid Pressure (psi) | 8 |
| Dispense Height (in) | 3 |
| Speed (in/sec) | 10 |
| Stroke (mils) | 5.5 |
| Pass Width (in) | 0.35 |
| # Passes | 1 |

FIG. 9 shows a graph of the etching temperature effect and the resulting haze (squares) and DOI (diamonds) for 12 micron particles after etching. A good correlation was observed between haze (best fit: y=0.5605x+3.1818; R$^2$=0.9145) and temperature. There was no significant effect on DOI. The acid mixture used was 5.5M HF/6.5M H$_2$SO$_4$.

Table 15 shows the etching results obtained using the draw down coating method.

TABLE 15

| Particle size (microns) | Gap (inch) | Etch time (secs) | Acid Concentration (M HF/M H$_2$SO$_4$) | Haze | Distinctness-of-Image (DOI) | Uniformity Rating[1] |
|---|---|---|---|---|---|---|
| 8 | 0.002 | 30 | 6/7 | 1.3 | 65 | OK |
| 8 | 0.0015 | 30 | 6/7 | 1.3 | 73 | OK |
| 8 | 0.001 | 30 | 6/7 | 1.3 | 74 | OK |
| 8 | 0.0005 | 30 | 6/7 | 3 | 43 | OK |
| 8 | 0.003 | 30 | 6/7 | 2.2 | 41 | OK |

The disclosure has been described with reference to various specific embodiments and techniques. However, it should be understood that many variations and modifications are possible while remaining within the scope of the disclosure.

What is claimed is:

1. A method of making an article having an anti-glare surface, comprising:
    depositing glass particles to adhere the particles on at least one glass surface of the article, wherein depositing glass particles on at least one glass surface of the article comprises:
    forming a concentrated liquid suspension of the glass particles,
    diluting the concentrated suspension with a liquid diluent, and
    contacting the at least one glass surface and the diluted suspension; and
    contacting the at least one glass surface of the article having the deposited and adhered glass particles and an etchant to form the anti-glare surface, and the etchant comprises at least one acid, wherein the anti-glare surface has a haze of from about 0.1 to about 30, a distinctness-of-image (DOI 20°) of from about 25 to about 85, and a surface roughness (Ra) of from about 50 to about 500 nm.

2. The method of claim 1 wherein the surface glass and the glass particles are independently comprised of at least one of a soda lime silicate glass, an alkaline earth aluminosilicate glass, an alkali aluminosilicate glass, an alkali borosilicate glass, a boroaluminosilicate glass, or a combination thereof, and the at least one etchant comprises at least one acid selected from HF, H$_2$SO$_4$, or a combination thereof.

3. The method of claim 1 wherein contacting the at least one surface of the article having the deposited glass particles and an etchant comprises exposing the surface having the deposited particles to the etchant for about 1 second to about 30 minutes.

4. The method of claim 1 wherein the deposited glass particles have a D$_{50}$ diameter of from about 1 to about 30 micrometers.

5. The method of claim 1 further comprising washing the resulting anti-glare surface, chemically strengthening the anti-glare surface, or a combination thereof.

6. The method of claim 1 further comprising, prior to etching, contacting at least another surface of the article with a removable, etch-resistant protective layer.

7. A method of creating an anti-glare glass surface, comprising:
    contacting a glass surface with a liquid diluted suspension of glass particles to produce a particulated glass surface; and
    contacting the resulting particulated glass surface and an etchant to form the anti-glare surface.

* * * * *